US010243081B2

(12) United States Patent
Yamazaki et al.

(10) Patent No.: US 10,243,081 B2
(45) Date of Patent: Mar. 26, 2019

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Junichi Koezuka, Tochigi (JP); Kenichi Okazaki, Tochigi (JP); Terumasa Ikeyama, Toride (JP); Katsuaki Tochibayashi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/075,775

(22) Filed: Mar. 21, 2016

(65) Prior Publication Data

US 2016/0284855 A1 Sep. 29, 2016

Related U.S. Application Data

(63) Continuation of application No. 13/746,751, filed on Jan. 22, 2013, now Pat. No. 9,293,589.

(30) Foreign Application Priority Data

Jan. 25, 2012 (JP) ................................. 2012-013451

(51) Int. Cl.
*H01L 29/786* (2006.01)
*H01L 29/66* (2006.01)
(Continued)

(52) U.S. Cl.
CPC ........ *H01L 29/7869* (2013.01); *H01L 21/385* (2013.01); *H01L 29/045* (2013.01);
(Continued)

(58) Field of Classification Search
CPC ........... H01L 29/4908; H01L 29/66969; H01L 29/78606; H01L 29/7869
See application file for complete search history.

(56) References Cited

U.S. PATENT DOCUMENTS

| 5,731,856 A | 3/1998 | Kim et al. |
|---|---|---|
| 5,744,864 A | 4/1998 | Cillessen et al. |

(Continued)

FOREIGN PATENT DOCUMENTS

| CN | 102084486 A | 6/2011 |
|---|---|---|
| EP | 1737044 A | 12/2006 |

(Continued)

OTHER PUBLICATIONS

Taiwanese Office Action (Application No. 102102480) dated Oct. 4, 2016.

(Continued)

*Primary Examiner* — Joseph Galvin, III
(74) *Attorney, Agent, or Firm* — Robinson Intellectual Property Law Office; Eric J. Robinson

(57) ABSTRACT

A highly reliable semiconductor device including a transistor using an oxide semiconductor is provided. In a semiconductor device including a bottom-gate transistor including an oxide semiconductor layer, a first insulating layer is formed in contact with the oxide semiconductor layer, and an oxygen doping treatment is performed thereon, whereby the first insulating layer is made to contain oxygen in excess of the stoichiometric composition. The formation of the second insulating layer over the first insulating layer enables excess oxygen included in the first insulating layer to be supplied efficiently to the oxide semiconductor layer. Accordingly, the highly reliable semiconductor device with stable electric characteristics can be provided.

27 Claims, 11 Drawing Sheets

(51) Int. Cl.
*H01L 29/49* (2006.01)
*H01L 21/385* (2006.01)
*H01L 29/04* (2006.01)

(52) U.S. Cl.
CPC .... *H01L 29/4908* (2013.01); *H01L 29/66969* (2013.01); *H01L 29/78606* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,205,640 B2 | 4/2007 | Yoshioka et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,459,726 B2 | 12/2008 | Kato et al. |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,247,811 B2 | 8/2012 | Morosawa et al. |
| 8,309,956 B2 | 11/2012 | Arai et al. |
| 8,324,621 B2 | 12/2012 | Yamazaki et al. |
| 8,384,077 B2 | 2/2013 | Yano et al. |
| 8,440,510 B2 | 5/2013 | Yamazaki |
| 8,470,650 B2 | 6/2013 | Akimoto et al. |
| 8,502,217 B2 | 8/2013 | Sato et al. |
| 8,629,438 B2 | 1/2014 | Yamazaki |
| 8,669,553 B2 | 3/2014 | Knutson et al. |
| 8,748,215 B2 | 6/2014 | Yamazaki |
| 8,790,960 B2 | 7/2014 | Yamazaki |
| 8,829,586 B2 | 9/2014 | Endo et al. |
| 8,946,700 B2 | 2/2015 | Akimoto et al. |
| 8,981,369 B2 | 3/2015 | Yano et al. |
| 9,006,729 B2 | 4/2015 | Akimoto et al. |
| 9,269,823 B2 | 2/2016 | Endo et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0069340 A1 | 3/2007 | Yamada et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0127265 A1* | 5/2010 | Kim .................. H01L 29/41733 257/59 |
| 2010/0224871 A1 | 9/2010 | Yamaguchi et al. |
| 2010/0283049 A1 | 11/2010 | Sato et al. |
| 2010/0320458 A1 | 12/2010 | Umeda et al. |
| 2010/0320459 A1 | 12/2010 | Umeda et al. |
| 2011/0095288 A1 | 4/2011 | Morosawa et al. |
| 2011/0116310 A1 | 5/2011 | Yamazaki et al. |
| 2011/0121887 A1 | 5/2011 | Kato et al. |
| 2011/0127521 A1 | 6/2011 | Yamazaki |
| 2011/0128275 A1 | 6/2011 | Ueda et al. |
| 2011/0140116 A1 | 6/2011 | Morosawa et al. |
| 2011/0193083 A1 | 8/2011 | Kim et al. |
| 2011/0215328 A1 | 9/2011 | Morosawa |
| 2011/0259420 A1 | 10/2011 | Yamazaki et al. |
| 2011/0260171 A1 | 10/2011 | Yamazaki |
| 2011/0263082 A1* | 10/2011 | Yamazaki ......... H01L 21/02321 438/158 |
| 2011/0263084 A1 | 10/2011 | Yamazaki |
| 2011/0263091 A1 | 10/2011 | Yamazaki |
| 2011/0281394 A1 | 11/2011 | Yamazaki |
| 2011/0284848 A1 | 11/2011 | Yamazaki |
| 2011/0312127 A1 | 12/2011 | Ishizuka et al. |
| 2012/0002090 A1 | 1/2012 | Aoki et al. |
| 2012/0049889 A1* | 3/2012 | Hatano ............... H01L 27/1156 326/102 |

(56) References Cited

U.S. PATENT DOCUMENTS

| | | | |
|---|---|---|---|
| 2012/0064650 A1* | 3/2012 | Yamazaki | H01L 27/1225 438/30 |
| 2012/0280234 A1 | 11/2012 | Koezuka et al. | |
| 2012/0302028 A1 | 11/2012 | Sandhu | |
| 2013/0092931 A1 | 4/2013 | Knutson et al. | |
| 2013/0134415 A1* | 5/2013 | Godo | H01L 29/66969 257/43 |
| 2013/0157422 A1 | 6/2013 | Yamazaki | |
| 2013/0161610 A1 | 6/2013 | Yamazaki | |
| 2014/0113408 A1 | 4/2014 | Yamazaki | |
| 2014/0308777 A1 | 10/2014 | Yamazaki | |
| 2014/0349443 A1 | 11/2014 | Yamazaki | |
| 2015/0108478 A1 | 4/2015 | Akimoto et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-247405 A | 9/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-318151 A | 12/2007 |
| JP | 2009-141002 A | 6/2009 |
| JP | 2009-224479 A | 10/2009 |
| JP | 2009-231613 A | 10/2009 |
| JP | 2010-016163 A | 1/2010 |
| JP | 2010-016347 A | 1/2010 |
| JP | 4415062 | 2/2010 |
| JP | 2010-067954 A | 3/2010 |
| JP | 2010-073881 A | 4/2010 |
| JP | 2010-074148 A | 4/2010 |
| JP | 2010-135462 A | 6/2010 |
| JP | 2010-177431 A | 8/2010 |
| JP | 2010-182818 A | 8/2010 |
| JP | 2010-186861 A | 8/2010 |
| JP | 4571221 | 10/2010 |
| JP | 2011-103452 A | 5/2011 |
| JP | 2011-109080 A | 6/2011 |
| JP | 2011-124561 A | 6/2011 |
| JP | 2011-129891 A | 6/2011 |
| JP | 2011-129938 A | 6/2011 |
| JP | 2011-135066 A | 7/2011 |
| JP | 2011-181906 A | 9/2011 |
| JP | 2011-243969 A | 12/2011 |
| JP | 2011-243973 A | 12/2011 |
| JP | 2011-258939 A | 12/2011 |
| JP | 2012-009843 A | 1/2012 |
| JP | 2013-531383 | 8/2013 |
| KR | 2011-0025768 A | 3/2011 |
| KR | 2012-0093975 A | 8/2012 |
| TW | 200522360 | 7/2005 |
| TW | 200941724 | 10/2009 |
| TW | 201140845 | 11/2011 |
| TW | 201203388 | 1/2012 |
| WO | WO-2003/098699 | 11/2003 |
| WO | WO-2004/114391 | 12/2004 |
| WO | WO-2008/133345 | 11/2008 |
| WO | WO-2009/072532 | 6/2009 |
| WO | WO-2009/075281 | 6/2009 |
| WO | WO-2010/001783 | 1/2010 |
| WO | WO-2010/021349 | 2/2010 |
| WO | WO-2011/046003 | 4/2011 |
| WO | WO-2011/048925 | 4/2011 |
| WO | WO-2011/058865 | 5/2011 |
| WO | WO-2011/062042 | 5/2011 |
| WO | WO-2011/065216 | 6/2011 |
| WO | WO-2011/096271 | 8/2011 |
| WO | WO-2011/132625 | 10/2011 |
| WO | WO-2011/142467 | 11/2011 |
| WO | WO-2012/002974 | 1/2012 |

OTHER PUBLICATIONS

International Search Report (Application No. PCT/JP2013/051229) dated Feb. 26, 2013.

Written Opinion (Application No. PCT/JP2013/051229) dated Feb. 26, 2013.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-

(56) References Cited

OTHER PUBLICATIONS crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5. pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park. Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12. pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Material:Aluminum Oxide(Al2O3),bulk, http;//www.memsnet.org/material/aluminumoxideal2o3bulk/, 2002, MEMS NET.

Taiwanese Office Action (Application No. 106107047) dated Apr. 19, 2018.

\* cited by examiner

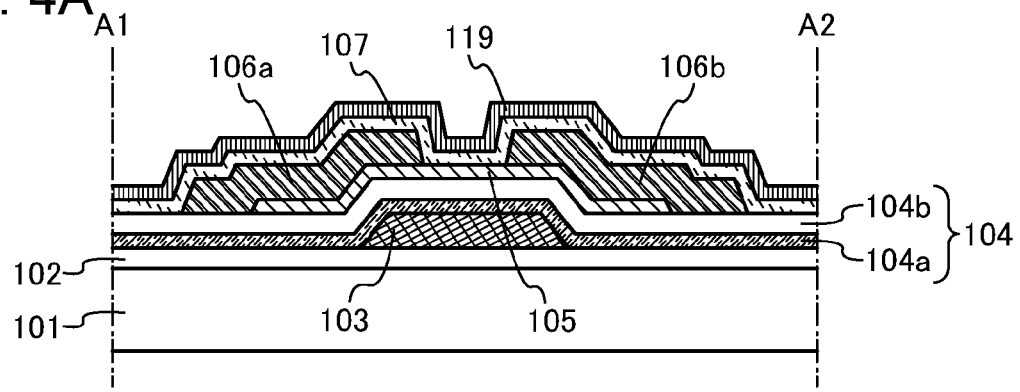
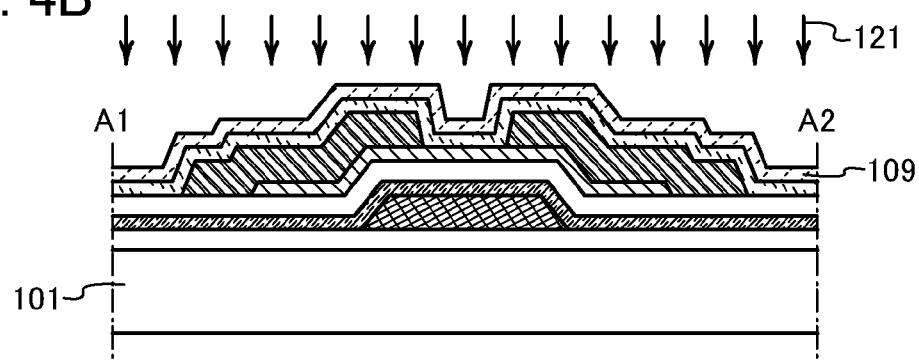
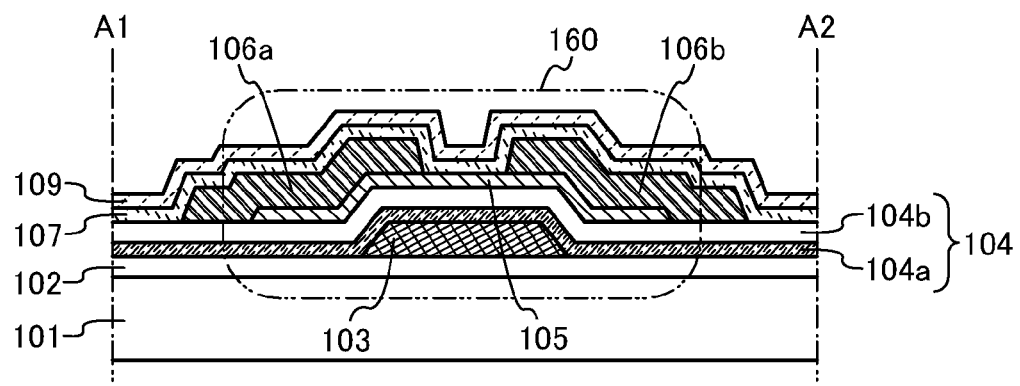
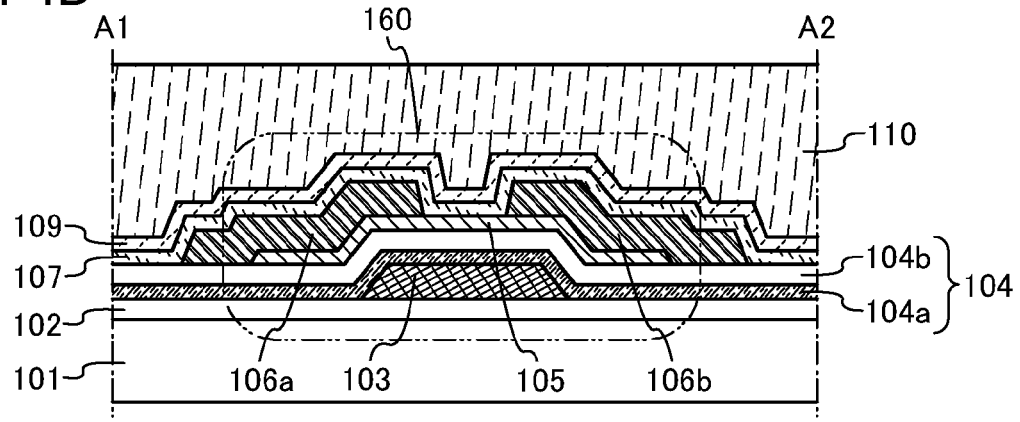

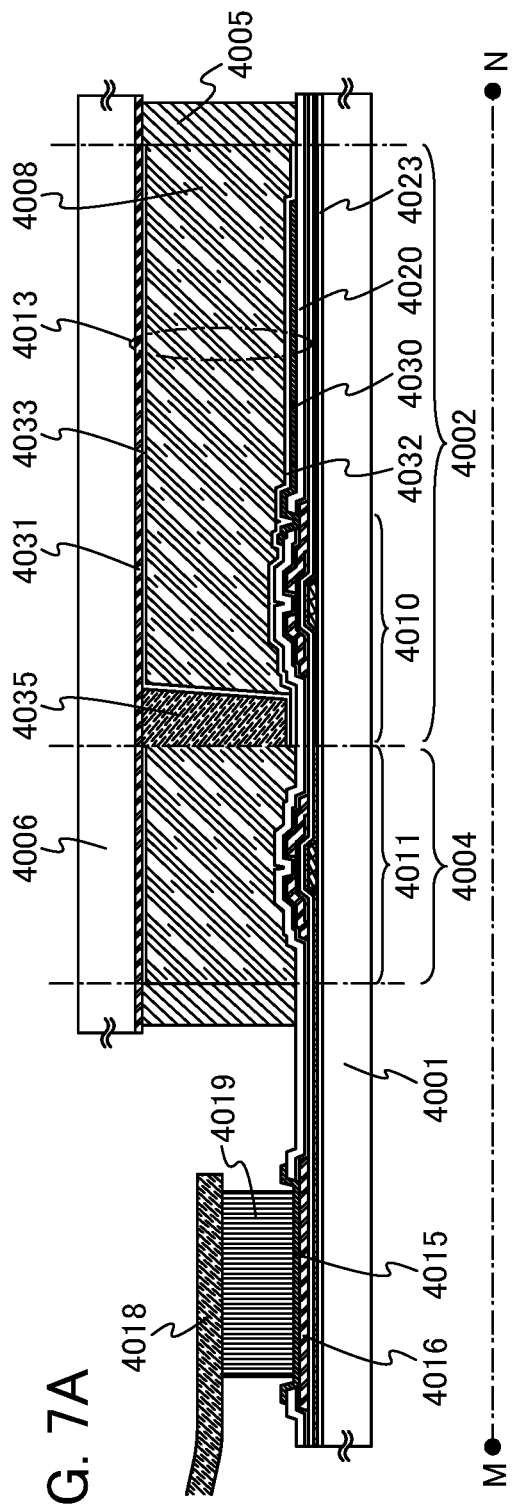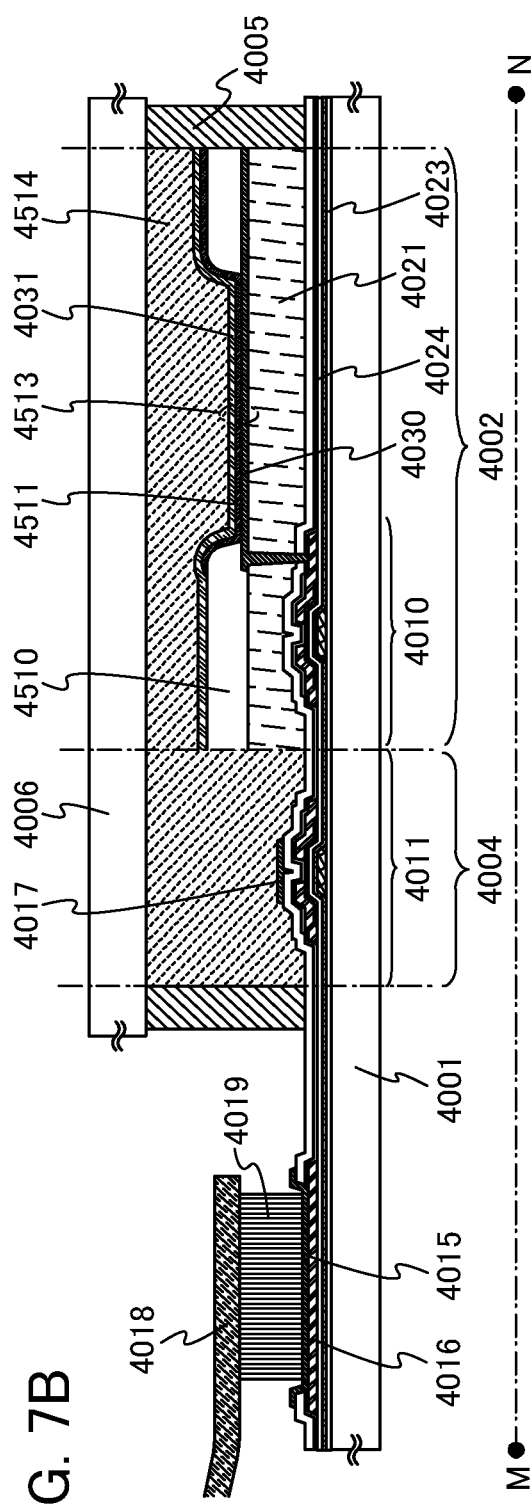

SEMICONDUCTOR DEVICE AND METHOD FOR MANUFACTURING SEMICONDUCTOR DEVICE

TECHNICAL FIELD

The present invention relates to a semiconductor device and a manufacturing method thereof.

In this specification and the like, the semiconductor device refers to any device which can function by utilizing semiconductor characteristics; an electro-optical device, a light-emitting display device, a semiconductor circuit, and an electronic device are all included in the category of the semiconductor device.

BACKGROUND ART

A technique by which a transistor is formed using a semiconductor thin film formed over a substrate having an insulating surface has been attracting attention. The transistor has been applied to a wide range of semiconductor electronic devices such as an integrated circuit (IC) and an image display device (also simply referred to as a display device). While a silicon-based semiconductor material is widely known as a material for the semiconductor thin film applicable to the transistor, an oxide semiconductor has been attracting attention as another material.

For example, a technique is disclosed by which a transistor is formed using zinc oxide or an In—Ga—Zn-based oxide as an oxide semiconductor (see Patent Documents 1 and 2).

Meanwhile, it has been pointed out that if hydrogen is contained in an oxide semiconductor, a donor is generated at a level close to the conduction band (a shallow level) to lower the resistance (make the oxide semiconductor an n-type oxide semiconductor). Therefore, some measures need to be taken to prevent hydrogen from entering the oxide semiconductor at the time of forming the oxide semiconductor. Further, the following technique is also disclosed: a change of the threshold voltage is suppressed by reducing the amount of hydrogen in not only the oxide semiconductor but also a gate insulating film in contact with the oxide semiconductor (see Patent Document 3).

REFERENCE

Patent Document 1: Japanese Published Patent Application No. 2007-123861
Patent Document 2: Japanese Published Patent Application No. 2007-096055
Patent Document 3: Japanese Published Patent Application No. 2009-224479

DISCLOSURE OF INVENTION

Further, an oxygen vacancy in an oxide semiconductor generates an electron that serves as a carrier in the oxide semiconductor. If many oxygen vacancies exist in an oxide semiconductor including a channel formation region of a transistor, electrons are generated in the channel formation region, which causes a shift of the threshold voltage of the transistor in the negative direction.

In view of the above problem, an object of one embodiment of the present invention is to provide a semiconductor device using an oxide semiconductor, which has stable electric characteristics and high reliability, and a manufacturing method thereof.

In a semiconductor device including a bottom-gate transistor including an oxide semiconductor layer, an insulating layer is formed in contact with the oxide semiconductor layer, and an oxygen doping treatment is performed on the insulating layer and the oxide semiconductor layer in contact with the insulating layer. With the oxygen doping treatment, the insulating layer and the oxide semiconductor layer in contact with the insulating layer each can be made to be in an oxygen-excess state where the content of oxygen is greater than that in the stoichiometric composition. Oxygen can be easily supplied from the insulating film containing excess oxygen, which is in contact with the oxide semiconductor layer, to the oxide semiconductor layer, whereby elimination of oxygen from the oxide semiconductor layer can be prevented and oxygen vacancies in the oxide semiconductor layer can be filled.

A first insulating layer subjected to an oxygen doping treatment may be formed over the oxide semiconductor layer, and a second insulating layer may be formed over the first insulating layer. The formation of the second insulating layer over the first insulating layer subjected to the oxygen doping treatment enables excess oxygen in the first insulating layer to be efficiently supplied to the oxide semiconductor layer.

The second insulating layer may be formed using a material similar to that of the first insulating layer, and preferably uses a metal oxide material having barrier properties exhibiting high blocking effect against both of impurities such as hydrogen or moisture and oxygen. Aluminum oxide is preferably used, for example.

Further, the second insulating layer may be formed using a material similar to that of the first insulating layer, and a metal oxide layer formed using a metal oxide material having barrier properties may be formed as a third insulating layer over the second insulating layer.

The metal oxide layer can be formed by forming a metal layer over the first insulating layer or the second insulating layer and then performing an oxygen doping treatment thereon to oxidize the metal layer.

The structure in which the insulating layer containing oxygen is sandwiched between the oxide semiconductor layer and the metal oxide layer having barrier properties can prevent entry of impurities such as hydrogen or moisture into the oxide semiconductor layer, which cause a change in electric characteristics, and release (elimination) of oxygen that is a main component of the oxide semiconductor from the oxide semiconductor layer in and after the manufacturing process of the transistor. Accordingly, electric characteristics and reliability of the transistor can be improved.

The metal oxide layer formed through the oxygen doping treatment preferably has a resistivity $\rho$ greater than or equal to $1 \times 10^{10}$ $\Omega \cdot m$ and less than or equal to $1 \times 10^{19}$ $\Omega \cdot m$, further preferably greater than or equal to $1 \times 10^{10}$ $\Omega \cdot m$ and less than or equal to $1 \times 10^{18}$ $\Omega \cdot m$, still further preferably greater than or equal to $1 \times 10^{11}$ $\Omega \cdot m$ and less than or equal to $1 \times 10^{15}$ $\Omega \cdot m$. The resistivity in the above range of the metal oxide layer leads to prevention of electrostatic breakdown of the transistor.

Further, the insulating layer in contact with the oxide semiconductor layer (e.g., an interlayer insulating layer or a gate insulating layer) preferably contains impurities such as water or hydrogen as little as possible. This is because if hydrogen is contained in the insulating layer in contact with the oxide semiconductor layer, the hydrogen may enter the oxide semiconductor layer or cause extraction of oxygen in the oxide semiconductor layer. Thus, the insulating layer in contact with the oxide semiconductor layer is preferably a layer which is subjected to a heat treatment for dehydration or dehydrogenation.

The "oxygen doping treatment" means that oxygen (which includes at least one of an oxygen radical, an oxygen atom, an oxygen molecule, ozone, an oxygen ion (oxygen molecule ion), and an oxygen cluster ion) is added to a bulk. The term "bulk" is used in order to clarify that oxygen is added not only to a surface of a thin film but also to the inside of the thin film. The "oxygen doping treatment" encompasses an "oxygen plasma doping treatment" in which plasmatized oxygen is added to the bulk. For the oxygen doping treatment, an ion implantation method, an ion doping method, a plasma immersion ion implantation method, a plasma treatment performed under an atmosphere containing oxygen, or the like can be employed. For the ion implantation method, a gas cluster ion beam may be used.

A gas containing oxygen can be used for the oxygen doping treatment. As the gas containing oxygen, oxygen, dinitrogen monoxide, nitrogen dioxide, carbon dioxide, carbon monoxide, or the like can be used. Further, a rare gas may be added to the gas containing oxygen for the oxygen doping treatment.

One embodiment of the present invention includes a gate electrode, a gate insulating layer formed over the gate electrode, an oxide semiconductor layer formed over the gate insulating layer to overlap with the gate electrode, a source electrode and a drain electrode which are formed over the oxide semiconductor layer, a first insulating layer provided over the source electrode and the drain electrode so as to be in contact with part of the oxide semiconductor layer, and a second insulating layer formed over the first insulating layer. The first insulating layer contains oxygen the amount of which is greater than that of oxygen in the stoichiometric composition.

It is preferable that the first insulating layer be thicker than 10 nm and thinner than 100 nm.

One embodiment of the present invention includes the steps of: forming a gate electrode; forming a gate insulating layer over the gate electrode; forming an oxide semiconductor layer over the gate insulating layer in a region which overlaps with the gate electrode; forming a source electrode and a drain electrode over the oxide semiconductor layer; forming a first insulating layer which contains oxygen the amount of which is greater than that of oxygen in the stoichiometric composition, over the source electrode and the drain electrode so as to be in contact with part of the oxide semiconductor layer; and forming a second insulating layer over the first insulating layer.

A third insulating layer may be formed over the second insulating layer. The second insulating layer and/or the third insulating layer are/is preferably a metal oxide layer(s) having barrier properties.

According to one embodiment of the present invention, a semiconductor device which uses an oxide semiconductor and can have stable electric characteristics and high reliability can be provided.

BRIEF DESCRIPTION OF DRAWINGS

In the accompanying drawings:

FIGS. 4A to 4D are cross-sectional views illustrating one embodiment of a method for manufacturing a semiconductor device;

FIGS. 7A and 7B are cross-sectional views each illustrating one embodiment of a semiconductor device;

BEST MODE FOR CARRYING OUT THE INVENTION

Figure 1A:
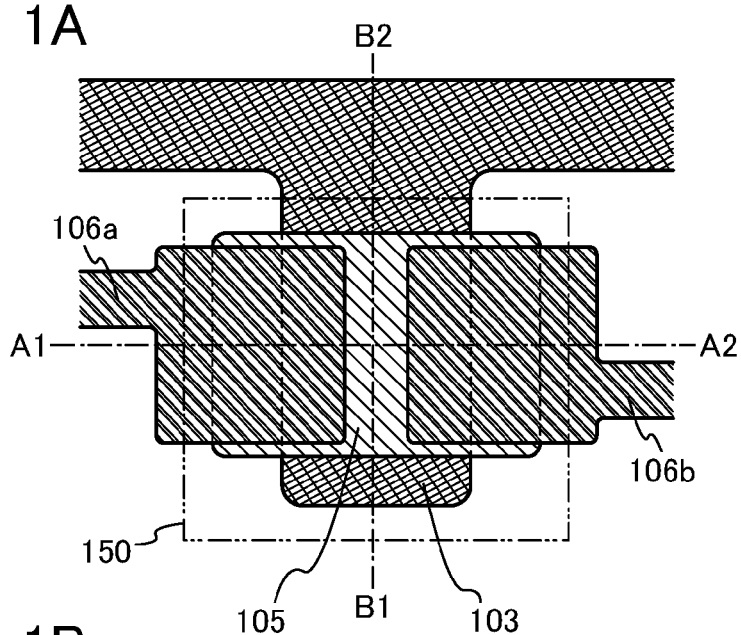
FIGS. 1A to 1C are a plan view and cross-sectional views illustrating one embodiment of a semiconductor device.

Hereinafter, embodiments of the invention disclosed in this specification are described with reference to the accompanying drawings. The invention disclosed in this specification is not limited to the following description, and it is easily understood for those skilled in the art that modes and details of the present invention can be modified in various ways. Therefore, the invention disclosed in this specification is not construed as being limited to the description of the following embodiments. Note that in structures of the present invention described below, the same portions or portions having similar functions are denoted by the same reference numerals throughout the drawings, and description thereof is not repeated. Further, the same hatching pattern, sometimes without a reference numeral, denotes portions having similar functions.

In this specification, ordinal numbers such as "first" and "second" are used in order to avoid confusion among components, and do not infer the numerical limitation of the components.

(Embodiment 1)

In this embodiment, a structure of a transistor which is one embodiment of a semiconductor device and a manufacturing method thereof are described. The transistor disclosed in this embodiment is a transistor which uses an oxide semiconductor for a semiconductor layer in which a channel is formed.

Figure 1B:
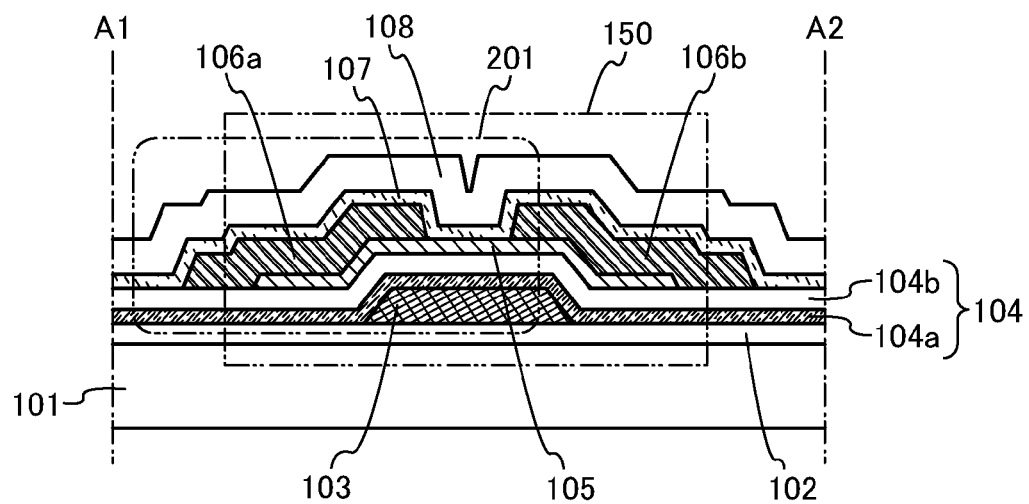
Figure 1C:
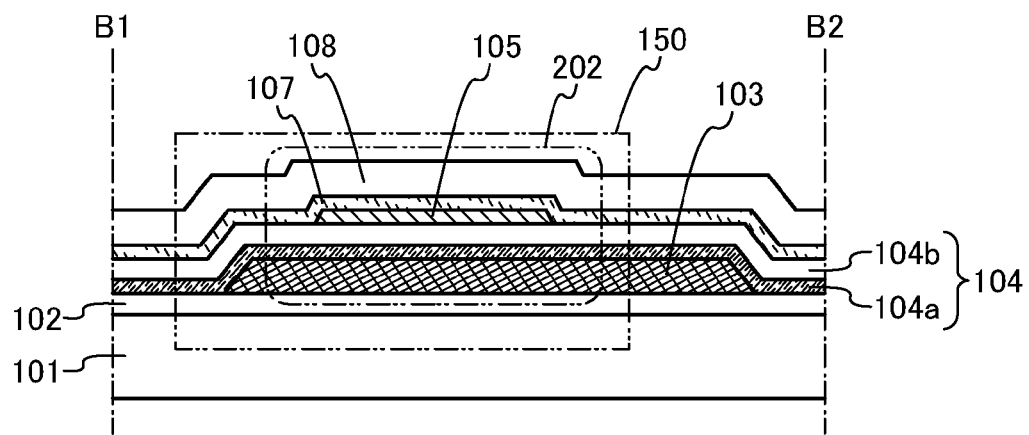

FIG. 1A is a top view illustrating a planar structure of a transistor 150 using an oxide semiconductor for its semiconductor layer in which a channel is formed, FIG. 1B is a cross-sectional view illustrating a cross-sectional structure taken along a chain line A1-A2 in FIG. 1A, and FIG. 1C is a cross-sectional view illustrating a cross-sectional structure taken along a chain line B1-B2 in FIG. 1A. For easy understanding, some of the components are not shown in FIG. 1A.

The transistor 150 illustrated in FIGS. 1A to 1C is a bottom-gate transistor having a channel-etched structure and is also an inverted staggered transistor.

In FIGS. 1A to 1C, an insulating layer 102 is formed over a substrate 101, a gate electrode 103 is formed over the insulating layer 102, and a gate insulating layer 104 is formed over the gate electrode 103. Although an example in which the gate insulating layer 104 consists of a stack of a gate insulating layer 104a and a gate insulating layer 104b is illustrated in FIGS. 1A to 1C, the gate insulating layer 104 is either a single layer or a stacked layer of a plurality of layers.

Further, an oxide semiconductor layer 105 is formed over the gate insulating layer 104, and a source electrode 106a and a drain electrode 106b are formed over the oxide semiconductor layer 105. An insulating layer 107 is formed over the source electrode 106a and the drain electrode 106b so as to be in contact with part of the oxide semiconductor layer 105, and an insulating layer 108 is formed over the insulating layer 107.

An oxide semiconductor used for the oxide semiconductor layer 105 preferably contains at least indium (In) or zinc (Zn). In particular, In and Zn are preferably contained. In addition, as a stabilizer for reducing variation in electric characteristics of the transistor using the oxide semiconductor, gallium (Ga) is preferably contained. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. Further, $SiO_2$ may be contained in the above oxide semiconductor.

Here, for example, the In—Ga—Zn-based oxide means an oxide containing indium (In), gallium (Ga), and zinc (Zn) and there is no particular limitation on the ratio of In:Ga:Zn. The In—Ga—Zn-based oxide may contain a metal element other than In, Ga, and Zn. The content of oxygen is preferably excess relative to that in the stoichiometric proportion of the oxide semiconductor. With the excess oxygen, generation of carriers attributed to oxygen vacancies in the oxide semiconductor can be suppressed.

For the oxide semiconductor layer, a thin film represented by a chemical formula $InMO_3(ZnO)_m$ (m>0) can be used, in which M denotes one or more metal elements selected from Sn, Zn, Ga, Al, Mn, and Co. Alternatively, a material represented by $In_2SnO_5(ZnO)_n$ (n>0) may be used as the oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with a composition suitable for requisite semiconductor characteristics (e.g., mobility, threshold voltage, and variation) may be used. Further, in order to obtain the requisite semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily with an In—Sn—Zn-based oxide. However, the mobility can be increased by reducing the defect density in a bulk, even with an In—Ga—Zn-based oxide.

Note that for example, the "composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, where r may be 0.05, for example. The same applies to other oxides.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

In an oxide semiconductor film in an amorphous state, a flat surface can be obtained relatively easily, so that interface scattering in a transistor formed using the oxide semiconductor film can be suppressed, whereby relatively high mobility can be obtained relatively easily.

In an oxide semiconductor film having crystallinity, defects in the bulk can be further reduced, and mobility higher than that of an oxide semiconductor film in an amorphous state can be obtained by improving the surface flatness. To improve the surface flatness, the oxide semiconductor film is preferably formed on a flat surface. Specifically, the oxide semiconductor film may be formed on a surface with an average surface roughness (Ra) of less than or equal to 1 nm, preferably less than or equal to 0.3 nm, further preferably less than or equal to 0.1 nm The average surface roughness (Ra) can be measured using an atomic force microscope (AFM).

In the case where an In—Zn-based oxide material is used as the oxide semiconductor film, the atomic ratio, In/Zn is greater than or equal to 0.5 and less than or equal to 50, preferably greater than or equal to 1 and less than or equal to 20, further preferably greater than or equal to 1.5 and less than or equal to 15. When the atomic ratio of Zn is in the above preferred range, the field-effect mobility of the transistor can be improved. Here, when the atomic ratio of the compound is In:Zn:O=X:Y:Z, the relation Z>1.5X+Y is satisfied.

For example, the oxide semiconductor film may include a CAAC-OS. In the CAAC-OS, for example, c-axes are aligned, and a-axes and/or b-axes are not macroscopically aligned.

For example, the oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, the oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

The oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Among the crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. In most cases, the crystal part fits inside a cube whose one side is less than 100 nm. From the observation with a transmission electron microscope (TEM), a boundary between the amorphous part and the crystal part and a boundary between the crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among the crystal parts, the directions of the a-axis and the b-axis of one crystal part may be different from those of another crystal part. In this specification, being "perpendicular" means an angle range from 80° to 100° both inclusive, preferably from 85° to 95° both inclusive, and being "parallel" means an angle range from −10° to 10° both inclusive, preferably from −5° to 5° both inclusive.

In the CAAC-OS film, distribution of the crystal parts is not necessarily uniform. For example, in the formation process of the CAAC-OS film, in the case where crystal growth commences from a surface side of the oxide semiconductor film, the proportion of crystal parts in the vicinity of the surface of the oxide semiconductor film gets higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Nitrogen may be substituted for part of constituent oxygen of the oxide semiconductor.

Further, in an oxide semiconductor having a crystal part such as the CAAC-OS, defects in the bulk can be further reduced, and mobility higher than that of an oxide semiconductor in an amorphous state can be obtained by improving the surface flatness. To improve the surface flatness, the oxide semiconductor is preferably formed on a flat surface. Specifically, the oxide semiconductor may be formed on a surface with an average surface roughness (Ra) of less than or equal to 1 nm, preferably less than or equal to 0.3 nm, further preferably less than or equal to 0.1 nm The average surface roughness (Ra) can be measured using an atomic force microscope (AFM).

Since the transistor 150 described in this embodiment is a bottom-gate transistor, the gate electrode 103 and the gate insulating layer 104 are positioned under the oxide semiconductor film. Thus, in order to obtain the above-described flat surface, a planarization treatment such as chemical mechanical polishing (CMP) treatment may be performed at least on a surface of the gate insulating layer 104, which overlaps with the gate electrode 103, after the gate electrode 103 and the gate insulating layer 104 are formed over the substrate.

The oxide semiconductor layer 105 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor layer 105 may be formed with a sputtering apparatus in which film is deposited with surfaces of a plurality of substrates set substantially perpendicular to a surface of a sputtering target.

Next, an example of a method for manufacturing the transistor 150 is described with reference to FIGS. 2A to 2D and FIGS. 3A to 3D.

Figure 2A:
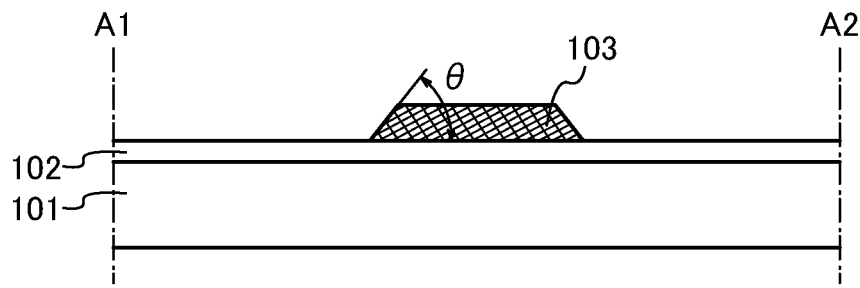
FIGS. 2A to 2D are cross-sectional views illustrating one embodiment of a method for manufacturing a semiconductor device.

First, the insulating layer 102 is formed over the substrate 101, and the gate electrode 103 is formed over the insulating layer 102 (see FIG. 2A). There is no particular limitation on a substrate used as the substrate 101 except that it needs to have heat resistance at least to withstand any heat treatment performed later. For example, a plastic substrate having heat resistance to withstand the process temperature in the manufacturing process can be used as well as a glass substrate, a ceramic substrate, a single-crystal semiconductor substrate or a polycrystalline semiconductor substrate of silicon, silicon carbide, or the like, a compound semiconductor substrate made of silicon germanium or the like, and an SOI substrate. Further, any of these substrates provided with a semiconductor element may also be used as the substrate 101.

As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. A flexible substrate may also be used as the substrate 101. In the case where a flexible substrate is used, the transistor 150 may be directly formed over the flexible substrate, or the transistor 150 may be formed over a manufacturing substrate, and then separated from the manufacturing substrate and transferred onto the flexible substrate. To separate and transfer the transistor from the manufacturing substrate to the flexible substrate, a separation layer may be provided between the manufacturing substrate and the transistor. In this embodiment, aluminoborosilicate glass is used for the substrate 101.

The insulating layer 102 functions as a base layer, and can prevent or reduce diffusion of an impurity element from the substrate 101. The insulating layer 102 is formed of a single layer or a stacked layer using one or more of materials selected from an aluminum nitride, an aluminum oxide, an aluminum nitride oxide, an aluminum oxynitride, a gallium oxide, a silicon nitride, a silicon oxide, a silicon nitride oxide, and a silicon oxynitride. In this specification, the nitride oxide refers to a material containing a larger amount of nitrogen than oxygen, and the oxynitride refers to a material containing a larger amount of oxygen than nitrogen. The content of each element can be measured by Rutherford backscattering spectrometry (RBS), for example. The insulating layer 102 can be formed by a sputtering method, a CVD method, a coating method, a printing method, or the like.

Further, a halogen element such as chlorine or fluorine may be contained in the insulating layer 102, whereby the function of preventing or reducing diffusion of impurity elements from the substrate 101 can be further improved. The concentration of a halogen element contained in the insulating layer 102 is preferably greater than or equal to $1 \times 10^{15}/cm^3$ and less than or equal to $1 \times 10^{20}/cm^3$ in its peak measured by secondary ion mass spectrometry (SIMS).

In this embodiment, as the insulating layer 102, a 200-nm-thick silicon oxynitride film is formed over the substrate 101 by a plasma CVD method. Further, the temperature in the formation of the insulating layer 102 is preferably high as much as possible but is lower than or equal to the temperature that the substrate 101 can withstand. For example, the insulating layer 102 is formed while the substrate 101 is heated at a temperature higher than or equal to 350° C. and lower than or equal to 450° C. The temperature in the formation of the insulating layer 102 is preferably constant. For example, the insulating layer 102 is formed while the substrate 101 is heated at 350° C.

After the insulating layer 102 is formed, a heat treatment may be performed thereon under reduced pressure, a nitrogen atmosphere, a rare gas atmosphere, or a nitrogen atmosphere with the ultra-dry air. By the heat treatment, the concentration of hydrogen, moisture, a hydride, a hydroxide, or the like contained in the insulating layer 102 can be reduced. It is preferable that the temperature of the heat treatment be as high as possible among temperatures that the substrate 101 can withstand. Specifically, the heat treatment is preferably performed at a temperature higher than or equal to the temperature in the formation of the insulating layer 102 and lower than the strain point of the substrate 101.

Further, after the insulating layer 102 is formed, an oxygen doping treatment may be performed on the insulating layer 102 to make the insulating layer 102 an oxygen-excess state. The oxygen doping treatment on the insulating layer 102 is preferably performed after the above-described heat treatment.

Next, a conductive layer to be the gate electrode 103 is formed by a sputtering method, a vacuum evaporation method, or a plating method. As a material for the conductive layer to be the gate electrode 103, a metal element selected from aluminum (Al), chromium (Cr), copper (Cu), tantalum (Ta), titanium (Ti), molybdenum (Mo), tungsten (W), neodymium (Nd), and scandium (Sc), an alloy containing any of these metal elements as a component, an alloy containing these metal elements in combination, a nitride of any of these metal elements, or the like can be used. Further, a material containing one or more metal elements selected from manganese (Mn), magnesium (Mg), zirconium (Zr), and beryllium (Be) may be used. A semiconductor typified by polycrystalline silicon including an impurity element such as phosphorus, or silicide such as nickel silicide may also be used.

The conductive layer to be the gate electrode 103 has either a single-layer structure or a stacked layer structure of two or more layers. Examples thereof are a single-layer structure using aluminum containing silicon, a two-layer structure in which titanium is stacked over aluminum, a two-layer structure in which titanium is stacked over a titanium nitride, a two-layer structure in which tungsten is stacked over a titanium nitride, a two-layer structure in which tungsten is stacked over a tantalum nitride, a two-layer structure in which Cu is stacked over a Cu—Mg—Al alloy, and a three-layer structure in which a titanium nitride, copper, and tungsten are stacked in this order.

For the conductive layer to be the gate electrode 103, a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added can be used. A stacked-layer structure of the above light-transmitting conductive material and a material containing the above metal element may also be used.

For the conductive layer to be the gate electrode 103, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) film can be used.

These materials each have a work function higher than or equal to 5 electron volts (eV); thus, with such a material for the gate electrode, the threshold voltage of the transistor can be made to be positive. Accordingly, a so-called normally-off n-type transistor can be achieved.

In this embodiment, a 100-nm-thick tungsten film is formed by a sputtering method as the conductive layer to be the gate electrode 103.

Next, part of the conductive layer to be the gate electrode 103 is selectively etched to form the gate electrode 103 (and a wiring which is formed of the same layer as the gate electrode 103). In the case of etching part of the conductive layer selectively, a resist mask may be formed over the conductive layer, and an unnecessary portion in the conductive layer may be removed by a dry etching method or a wet etching method. Further, that etching may be conducted by a combination of a dry etching method and a wet etching method. The resist mask formed over the conductive layer can be formed by a photolithography method, a printing method, an inkjet method, or the like. Formation of the resist mask by an inkjet method needs no photomask; thus, manufacturing cost can be reduced.

In the case where the conductive layer is etched by the dry etching method, a gas containing a halogen element can be used as the etching gas. As an example of the gas containing a halogen element, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr), or oxygen can be used as appropriate. An inert gas may be added to the etching gas. As the dry etching method, a reactive ion etching (RIE) method can be used.

As a plasma source, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

Note that a process in which a resist mask having an appropriate shape is formed over a conductive layer or an insulating layer by a photolithography method is referred to as a photolithography process; in general, after the formation of the resist mask, an etching step and a separation step of the resist mask are performed in many cases. Thus, unless otherwise specified, a photolithography process in this specification includes a step of forming a resist mask, a step of etching a conductive layer or an insulating layer, and a step of removing the resist mask.

Further, the cross-sectional shape (e.g., the taper angle or the thickness) of the gate electrode 103, specifically in its end portion is devised, whereby the coverage with the layer formed over the gate electrode 103 can be improved.

Specifically, the end portion of the gate electrode 103 is etched to have a taper shape such that the cross-sectional shape of the gate electrode 103 becomes trapezoidal or triangle. Here, the end portion of the gate electrode 103 has a taper angle θ of 60° or less, preferably 45° or less, further preferably 30° or less. Setting the taper angle within such a range makes it possible to attenuate the electric-field concentration which might occur near the end portion of the source electrode 106a or the drain electrode 106b by application of a high gate voltage to the gate electrode 103. Note that the taper angle θ refers to an inclination angle formed by the side surface and bottom surface of the layer having a taper shape when the layer is seen from the direction perpendicular to the cross section of the layer (i.e., the plane perpendicular to the surface of the substrate). A taper angle smaller than 90° is called forward tapered angle and a taper angle of larger than or equal to 90° is called inverse tapered angle. The same applies to any other layer; by providing a forward taper shape for the end portion of the layer, disconnection of a layer covering the layer (disconnection caused by a step) can be prevented, so that the coverage becomes good.

Figure 2B:
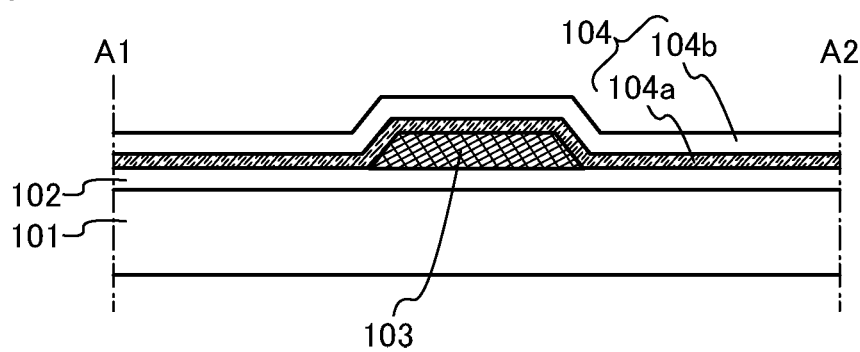

Next, the gate insulating layer 104 is formed over the gate electrode 103 (see FIG. 2B).

Note that a planarization treatment may be performed on a surface of the gate electrode 103 in order to improve coverage with the gate insulating layer 104. It is preferable that the planarity of the surface of the gate electrode 103 be good particularly when a thin insulating layer is used as the gate insulating layer 104.

The gate insulating layer 104 can be formed by a sputtering method, an MBE method, a CVD method, a pulsed laser deposition method, an ALD method, or the like as appropriate. A high-density plasma CVD method using a microwave (e.g., with a frequency of 2.45 GHz) or the like can also be applied. The gate insulating layer 104 may be formed using a sputtering apparatus which performs film formation with surfaces of a plurality of substrates set substantially perpendicular to a surface of a sputtering target.

The gate insulating layer 104 can be formed of a single layer or a stacked layer using one or more materials selected from an aluminum nitride, an aluminum oxide, an aluminum nitride oxide, an aluminum oxynitride, a gallium oxide, a silicon nitride, a silicon oxide, a silicon nitride oxide, and a silicon oxynitride. In this embodiment, as the gate insulating layer 104, a stack of the gate insulating layers 104a and 104b is used.

Generally, a capacitor has such a structure that a dielectric is sandwiched between two electrodes that face to each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, leakage current flowing between the two electrodes tends to increase and the withstand voltage of the capacitor tends to lower.

A portion where a gate electrode, a gate insulating layer, and a semiconductor layer of a transistor overlap with each other functions as the above-described capacitor (hereinafter also referred to as "gate capacitor"). A channel is formed in a region in the semiconductor layer, which overlaps with the gate electrode with the gate insulating layer provided therebetween. In other words, the gate electrode and the channel formation region function as two electrodes of the capacitor, and the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as a hafnium silicate ($HfSi_xO_y$ (x>0, y>0)), a hafnium silicate to which nitrogen is added ($HfSi_xO_yN_z$ (x>0, y>0, z>0)), a hafnium aluminate to which nitrogen is added ($HfAl_xO_yN_z$ (x>0, y>0, z>0)), a hafnium oxide, or an yttrium oxide is used for the gate insulating layer 104, even if the thickness of the gate insulating layer 104 is made thick, sufficient capacitance between the gate electrode 103 and the oxide semiconductor layer 105 can be ensured.

For example, in the case where a high-k material with a high dielectric constant is used for the gate insulating layer 104, even if the gate insulating layer 104 is made thick, a capacitance equivalent to that in the case of using a silicon oxide for the gate insulating layer 104 can be obtained, thereby reducing the leakage current between the gate electrode 103 and the oxide semiconductor layer 105. Further, leakage current between the wiring formed of the same layer as the gate electrode 103 and another wiring that overlaps with the wiring can also be reduced. The gate electrode layer 104 may have a stacked-layer structure of the high-k material and the above-described material.

Further, the gate insulating layer 104 preferably contains oxygen in a portion which is in contact with the oxide semiconductor layer 105. In this embodiment, the gate insulating layer 104b in contact with the oxide semiconductor layer 105 preferably contains in its film (bulk), oxygen the amount of which is at least greater than that in the stoichiometric proportion. For example, in the case where a silicon oxide film is used as the gate insulating layer 104b, the composition formula is $SiO_{2+\alpha}$ ($\alpha$>0). By using this silicon oxide film as the gate insulating layer 104b, oxygen can be supplied to the oxide semiconductor layer 105, so that favorable characteristics can be obtained.

For the gate insulating layer 104a, a material having barrier properties against oxygen and impurities such as hydrogen, moisture, a hydride, or a hydroxide, for example, a silicon nitride or an aluminum oxide is preferably used. By forming the gate insulating layer 104a with use of the material having barrier properties, not only entrance of the above-described impurities from the substrate side but also diffusion of oxygen contained in the gate insulating layer 104b into the substrate side can be prevented. The use of the material having barrier properties for the gate insulating layer 104 enables the insulating layer 102 functioning as a base layer not to be provided.

Further, before the gate insulating layer 104 is formed, an impurity such as moisture or an organic substance which is attached to the surface of a plane on which the layer is formed is preferably removed by a plasma treatment using oxygen, dinitrogen monoxide, a rare gas (a typical example thereof is argon), or the like.

Further, after the gate insulating layer 104 is formed, a heat treatment may be performed under reduced pressure, a nitrogen atmosphere, a rare gas atmosphere, or a nitrogen atmosphere with the ultra-dry air. By the heat treatment, the concentration of hydrogen, moisture, a hydride, a hydroxide, or the like in the gate insulating layer 104 can be reduced. It is preferable that the temperature of the heat treatment be as high as possible among temperatures that the substrate 101 can withstand. Specifically, the heat treatment is preferably performed at a temperature higher than or equal to the temperature in the formation of the gate insulating layer 104 and lower than the strain point of the substrate 101.

Further, after the gate insulating layer 104 is formed, an oxygen doping treatment may be performed on the gate insulating layer 104 to make the gate insulating layer 104 an oxygen-excess state. For the oxygen doping treatment, an ion implantation method, an ion doping method, a plasma immersion ion implantation method, a plasma treatment performed under an atmosphere containing oxygen, or the like can be employed. The oxygen doping treatment on the gate insulating layer 104 is preferably performed after the above-described heat treatment.

The gate insulating layer 104 containing a large (excessive) amount of oxygen, which serves as an oxygen supply source, is provided so as to be in contact with the oxide semiconductor layer 105, so that oxygen can be supplied from the gate insulating layer 104 to the oxide semiconductor layer 105 by a/the heat treatment performed later.

By the oxygen supplied to the oxide semiconductor layer 105, oxygen vacancies in the oxide semiconductor layer 105 can be filled. The gate insulating layer 104 is preferably formed in consideration of the size of the transistor and the step coverage with the gate electrode 103.

Next, an oxide semiconductor layer 115 (not shown) to be the oxide semiconductor layer 105 is formed over the gate insulating layer 104 (the gate insulating layer 104b) by a sputtering method.

A planarization treatment may be performed on a region of the gate insulating layer 104 with which the oxide semiconductor layer 105 is formed in contact before the formation of the oxide semiconductor layer 115. There is no particular limitation on the plararization treatment; a polishing treatment (e.g., CMP treatment), a dry etching treatment, or a plasma treatment can be used.

As the plasma treatment, reverse sputtering in which an argon gas is introduced and plasma is generated can be performed. The reverse sputtering is a method in which voltage is applied to the substrate side with use of an RF power source in an argon atmosphere and plasma is generated in the vicinity of the substrate so that a surface is modified. Instead of the argon atmosphere, a nitrogen atmosphere, a helium atmosphere, an oxygen atmosphere, or the like may be used. With the reverse sputtering, particle substances (also referred to as particles or dust) attached to the surface of the gate insulating layer 104 can be removed.

Further, as the planarization treatment, a polishing treatment, a dry etching treatment, or a plasma treatment may be performed plural times, or these treatments may be performed in combination. In the case where the treatments are performed in combination, there is no particular limitation on the order of steps and the order can be set as appropriate depending on the roughness of the surface of the gate insulating layer 104.

A rare gas (a typical example thereof is argon) atmosphere, an oxygen gas atmosphere, or a mixed gas of a rare gas and oxygen is used as appropriate as a sputtering gas used for forming the oxide semiconductor layer 115. It is preferable that a high-purity gas from which impurities such as hydrogen, water, a hydroxyl group, and a hydride are removed be used as the sputtering gas.

The oxide semiconductor layer 115 is preferably formed under a condition that much oxygen is contained (e.g., by a sputtering method in an atmosphere where the proportion of oxygen is 100%) so as to contain much or oversaturated oxygen (preferably include a region containing oxygen in excess of the stoichiometric composition of the oxide semiconductor in a crystalline state).

For example, in the case where an oxide semiconductor layer is formed by a sputtering method, it is preferably performed under conditions where the proportion of oxygen in the sputtering gas is large; it is preferable that the sputtering gas contains an oxygen gas at 100%. The deposition under the conditions where the proportion of oxygen in the sputtering gas is large, in particular, in an atmosphere containing an oxygen gas at 100% enables release of Zn from the oxide semiconductor layer to be suppressed even when the deposition temperature is, for example, higher than or equal to 300° C.

It is preferable that the oxide semiconductor layer 115 be highly purified so as to contain impurities such as copper, aluminum, or chlorine as little as possible. In a process for manufacturing the transistor, a step which has no risk that such impurities enter the oxide semiconductor layer or adhere to the surface of the oxide semiconductor layer is preferably selected as appropriate. Specifically, the copper concentration in the oxide semiconductor layer is less than or equal to $1 \times 10^{18}$ atoms/cm$^3$, preferably less than or equal to $1 \times 10^{17}$ atoms/cm$^3$. In addition, the aluminum concentration in the oxide semiconductor layer is less than or equal to $1 \times 10^{18}$ atoms/cm$^3$. Further, the chlorine concentration in the oxide semiconductor layer is less than or equal to $2 \times 10^{18}$ atoms/cm$^3$.

The concentrations of alkali metals such as sodium (Na), lithium (Li), and potassium (K) in the oxide semiconductor layer 115 are as follows: the concentration of Na is $5 \times 10^{16}$ cm$^{-3}$ or less, preferably $1 \times 10^{16}$ cm$^{-3}$ or less, further preferably $1 \times 10^{15}$ cm$^{-3}$ or less; the concentration of Li is $5 \times 10^{15}$ cm$^{-3}$ or less, preferably $1 \times 10^{15}$ cm$^{-3}$ or less; and the concentration of K is $5 \times 10^{15}$ cm$^{-3}$ or less, preferably $1 \times 10^{15}$ cm$^3$ or less.

In this embodiment, as the oxide semiconductor layer 115, a 35-nm-thick In—Ga—Zn-based oxide (IGZO) film is formed by a sputtering method using a sputtering apparatus including an AC power supply device. As a target in the sputtering method, a metal oxide target whose composition is In:Ga:Zn=1:1:1 (atomic ratio) is used.

The relative density (the fill rate) of the metal oxide target is greater than or equal to 90% and less than or equal to 100%, preferably greater than or equal to 95% and less than or equal to 99.9%. With the metal oxide target with high relative density, a dense oxide semiconductor layer can be formed.

First, the substrate 101 is held in a deposition chamber kept under reduced pressure. Then, a sputtering gas from which hydrogen and moisture are removed is introduced into the deposition chamber while moisture remaining therein is removed, and the oxide semiconductor layer 115 is formed over the gate insulating layer 104 with use of the above target. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. A hydrogen atom, a compound containing a hydrogen atom, such as water (H$_2$O), (preferably a compound containing a carbon atom), or the like is removed from the deposition chamber which is evacuated with the cryopump, whereby the concentration of impurities in the oxide semiconductor layer 115 formed in the deposition chamber can be reduced.

Further, the gate insulating layer 104 and the oxide semiconductor layer 115 may be formed continuously without exposure to the air. Such continuous formation of the gate insulating layer 104 and the oxide semiconductor layer 115 without exposure to the air can prevent impurities such as hydrogen and moisture from being attached to a surface of the gate insulating layer 104.

Figure 2C:
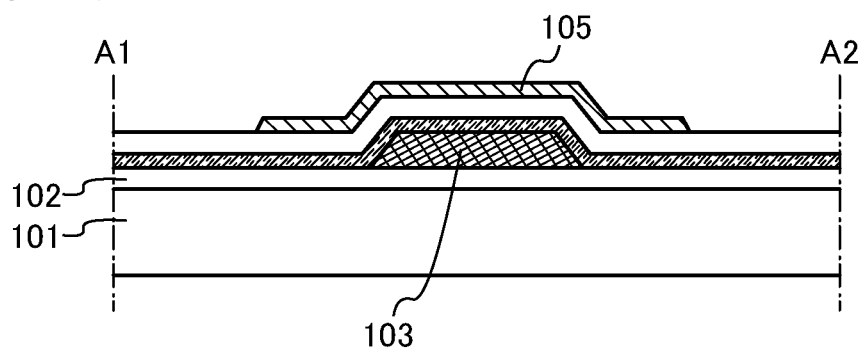

Next, a part of the oxide semiconductor layer 115 is selectively etched by a photolithography process to form the island-shaped oxide semiconductor layer 105 (see FIG. 2C). A resist mask used for forming the island-shaped oxide semiconductor layer 105 may be formed by an inkjet method. Formation of the resist mask by an inkjet method needs no photomask; thus, manufacturing cost can be reduced.

Note that the etching of the oxide semiconductor layer 115 may be conducted by a dry etching method, a wet etching method, or both of them. In the case where the oxide semiconductor layer 115 is etched by a wet etching method, a solution obtained by mixing phosphoric acid, acetic acid, and nitric acid, a solution containing oxalic acid, or the like can be used as the etchant. Alternatively, ITO-07N (produced by KANTO CHEMICAL CO., INC.) may be used. In the case where the oxide semiconductor layer 115 is etched by a dry etching method, for example, a dry etching method using a high-density plasma source such as an electron cyclotron resonance (ECR) source or an inductively coupled plasma (ICP) source can be used. As a dry etching method by which uniform electric discharge can be performed over a large area, there is a dry etching method using an enhanced capacitively coupled plasma (ECCP) mode. This dry etching method can be applied even to the case where a substrate of the tenth generation or above, the size of which exceeds 3 m, is used as the substrate, for example.

Further, a heat treatment may be performed in order to remove excess hydrogen (including water or a hydroxyl group) from the oxide semiconductor layer 105 (to perform dehydration or dehydrogenation) after formation of the oxide semiconductor layer 105. The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate may be put in an electric furnace which is a kind of heat treatment apparatus, and the oxide semiconductor layer 105 may be subjected to a heat treatment at 450° C. for one hour in a nitrogen atmosphere.

The heat treatment apparatus is not limited to the electric furnace; a device for heating an object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object to be processed by a heat treatment, such as nitrogen or a rare gas like argon, is used.

For example, as the heat treatment, GRTA may be performed as follows; the substrate is put in an inert gas heated at a high temperature of 650° C. to 700° C., is heated for several minutes, and is taken out of the inert gas.

In the heat treatment, it is preferable that moisture, hydrogen, and the like be contained as less as possible in the nitrogen or the rare gas such as helium, neon, or argon. The purity of the nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or less, further preferably 0.1 ppm or less).

After the semiconductor layer 105 is heated by the heat treatment, a high-purity oxygen gas, a high-purity dinitrogen monoxide gas, or ultra-dry air (air with a moisture amount of less than or equal to 20 ppm (−55° C. by conversion into a dew point), preferably less than or equal to 1 ppm, or further preferably less than or equal to 10 ppb according to the measurement with use of a dew point meter of a cavity ring down laser spectroscopy (CRDS) system) may be introduced into the same furnace. It is preferable that water, hydrogen, or the like be contained as less as possible in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or less, further preferably 0.1 ppm or less). By the effect of the oxygen gas or the dinitrogen monoxide gas, oxygen which is a main component of the oxide semiconductor and which has been reduced at the same time as the step for removing impurities by dehydration or dehydrogenation is supplied, so that oxygen vacancies in the oxide semiconductor can be reduced, whereby the oxide semiconductor layer 105 can be made an i-type (intrinsic) or substantially i-type oxide semiconductor layer. In this respect, to make the oxide semiconductor an i-type oxide semiconductor is unlike silicon, to make an i-type by addition of an impurity element, and thus contains a novel technological thought.

The timing of performing the heat treatment for dehydration or dehydrogenation is either before or after the island-shaped oxide semiconductor layer 105 is formed as long as it is after formation of the oxide semiconductor layer. The heat treatment for dehydration or dehydrogenation may be performed plural times and may also serve as another heat treatment.

By the dehydration or dehydrogenation treatment, oxygen which is a main component of the oxide semiconductor might be eliminated and thus reduced. There is an oxygen vacancy in a portion where oxygen is eliminated in the oxide semiconductor layer, which causes a donor level which causes a change in the electric characteristics of the transistor owing to the oxygen vacancy.

For the above reason, an oxygen doping treatment may be performed on the oxide semiconductor layer 105 after the dehydration or dehydrogenation treatment is performed, so that oxygen can be supplied to the oxide semiconductor layer 105.

Such supply of oxygen by introduction of oxygen into the oxide semiconductor layer 105 after the dehydration or dehydrogenation treatment is performed enables a reduction in oxygen vacancies generated in the oxide semiconductor by the step of removing impurities by the dehydration or dehydrogenation treatment, so that the oxide semiconductor layer 105 can be made an i-type (intrinsic). The change in electric characteristics of the transistor including the i-type (intrinsic) oxide semiconductor layer 105 is suppressed, and thus the transistor is electrically stable.

In the case where oxygen is introduced into the oxide semiconductor layer 105, the oxygen doping treatment is performed either directly or through another layer into the oxide semiconductor layer 105.

By the introduction of oxygen, the bond of a constituent element of the oxide semiconductor layer 105 and hydrogen or the bond of the constituent element and a hydroxy group is cut, and that hydrogen or that hydroxy group reacts to oxygen, so that water is generated. Therefore, hydrogen or a hydroxy group, which is an impurity, is more likely to be eliminated in the form of water by performing a heat treatment after the oxygen introduction. From the reason above, a heat treatment may be performed after oxygen is introduced into the oxide semiconductor layer 105. After that, oxygen may be further introduced into the oxide semiconductor layer 105 to make the oxide semiconductor layer 105 an oxygen-excess state. The introduction of oxygen and the heat treatment on the oxide semiconductor layer 105 may be performed alternately a plurality of times. The introduction of oxygen and the heat treatment may be performed at the same time.

As described above, it is preferable that the oxide semiconductor layer 105 be highly purified by sufficiently removing impurities such as hydrogen and be made an i-type (intrinsic) or substantially i-type (intrinsic) oxide semiconductor layer by reducing oxygen vacancies in the oxide semiconductor layer 105 by sufficiently supplying oxygen thereto.

Note that an oxide semiconductor which is highly purified (purified OS) by reduction of an impurity such as moisture or hydrogen which serves as an electron donor (donor) can be made to be an i-type (intrinsic) oxide semiconductor or an oxide semiconductor extremely close to an i-type semiconductor (a substantially i-type oxide semiconductor) by then supplying oxygen to the oxide semiconductor to reduce oxygen vacancies in the oxide semiconductor. A transistor using the i-type or substantially i-type oxide semiconductor for its semiconductor layer where a channel is formed features extremely small off-state current.

Specifically, the hydrogen concentration in the highly purified oxide semiconductor layer is preferably $5\times10^{19}$ atoms/cm$^3$ or less, further preferably $5\times10^{18}$ atoms/cm$^3$ or less, still further preferably $5\times10^{17}$ atoms/cm$^3$ or less according to the measurement with SIMS. In order that the oxide semiconductor layer 105 is supersaturated with oxygen by sufficient supply of oxygen, it is preferable that insulating layers each containing much oxygen (such as silicon oxide layers) be provided so as to sandwich and be in contact with the oxide semiconductor layer 105.

Here, the hydrogen concentration in the insulating layer containing much oxygen is also important because it has effect upon the characteristics of the transistor. In the case where the hydrogen concentration in the insulating layer containing much oxygen is greater than or equal to $7.2\times10^{20}$ atoms/cm$^3$, variation in initial characteristics of the transistor is increased, the channel length dependence of electric characteristics of the transistor is increased, and the transistor is significantly degraded by a BT stress test; therefore, the hydrogen concentration in the insulating layer containing much oxygen is preferably less than $7.2\times10^{20}$ atoms/cm$^3$. That is, it is preferable that the hydrogen concentration in the oxide semiconductor layer be less than or equal to $5\times10^{19}$ atoms/cm$^3$ and the hydrogen concentration in the insulating layer containing excessive oxygen is less than $7.2\times10^{20}$ atoms/cm$^3$.

The SIMS analysis of the hydrogen concentration is mentioned here. It is known that it is difficult to precisely obtain data in the proximity of a surface of a sample or in the proximity of an interface between stacked layers formed of different materials by the SIMS analysis in the principle. Thus, in the case where the distribution of the concentration of hydrogen in the layer in a thickness direction is analyzed by SIMS, an average value in a region of the layer in which the value is not greatly changed and substantially the same value can be obtained is employed as the hydrogen concentration. Further, in the case where the thickness of the layer is small, such a region with an almost constant value can sometimes not be obtained due to the influence of the hydrogen concentration in the adjacent film. In that case, the maximum value or the minimum value of the hydrogen concentration of a region where the layer is positioned is adopted as the hydrogen concentration of the layer. Furthermore, in the case where a mountain-shaped peak having the maximum value or a valley-shaped peak having the minimum value do not exist in the region where the layer is positioned, the value of the inflection point is adopted as the hydrogen concentration.

Figure 2D:
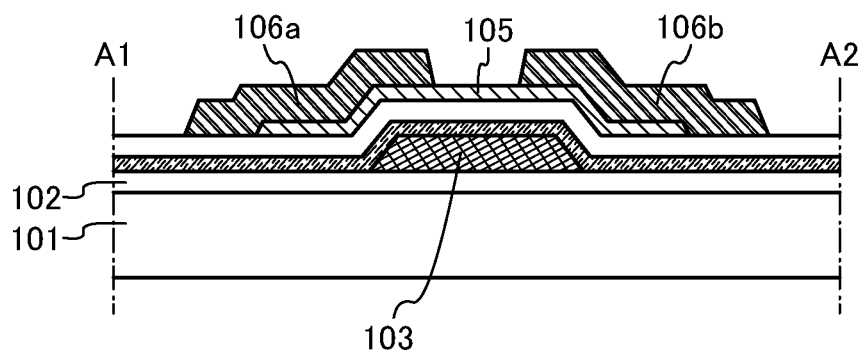

Next, a conductive layer 117 (not shown) is formed over the oxide semiconductor layer 105, and part of the conductive layer 117 is selectively etched by a photolithography process, whereby the source electrode 106a and the drain electrode 106b are formed (see FIG. 2D).

The conductive layer 117 to be the source electrode 106a and the drain electrode 106b is formed using a material which can withstand a heat treatment performed later. For the conductive layer 117, a metal containing an element selected from Al, Cr, Cu, Ta, Ti, Mo, and W, a metal nitride containing any of the above elements as a component (e.g., a titanium nitride, a molybdenum nitride, or a tungsten nitride), or the like can be used, for example. A refractory metal film of Ti, Mo, W, or the like or a metal nitride film of any of these elements (a titanium nitride film, a molybdenum nitride film, or a tungsten nitride film) may be stacked either under or on or both of under and on the metal layer of Al, Cu, or the like. Alternatively, the conductive layer 117 may be formed using a conductive metal oxide. As the conductive metal oxide, an indium oxide ($In_2O_3$), a tin oxide ($SnO_2$), a zinc oxide (ZnO), an indium oxide-tin oxide ($In_2O_3$—$SnO_2$; abbreviated to ITO), an indium oxide-zinc oxide ($In_2O_3$—ZnO), or any of these metal oxide materials in which a silicon oxide is contained can be used.

In this embodiment, a 200-nm-thick titanium film is formed by a sputtering method as the conductive layer 117. The conductive layer 117 can be etched by a method similar to that used for the formation of the gate electrode 103. For example, an ICP etching method can be used under conditions in which the etching gas is $BCl_3$:$Cl_2$=750 sccm: 150 sccm, the bias power is 1500 W, the ICP power source is 0 W, and the pressure is 2.0 Pa.

A constituent element of the source electrode 106a and the drain electrode 106b, an element inherent in the process chamber, and a constituent element of the etching gas used for the etching are attached as impurities to a surface of the oxide semiconductor layer 105, which is exposed due to the formation of the source electrode 106a and the drain electrode 106b, in some cases.

Such attachment of the impurities tends to bring an increase in off-state current of the transistor or deterioration of the electric characteristics of the transistor. Further, a parasitic channel tends to be generated in the oxide semiconductor layer 105, which leads to electrical connection of electrodes, which need be electrically isolated from each other, through the oxide semiconductor layer 105.

Further, depending on the impurities, the impurities may enter a vicinity of the surface or the side surface of the oxide semiconductor layer 105 to extract oxygen from the oxide semiconductor layer 105, so that oxygen vacancies are generated in the vicinity of the surface or the side surface of the oxide semiconductor layer 105. For example, chlorine or boron contained in the above-described etching gas or aluminum which is a constituent material in the process chamber may make the oxide semiconductor layer 105 n-type.

In view of the above, in one embodiment of the present invention, a cleaning treatment for removing impurities (treatment for removing impurities) which are attached to the surfaces or the side surfaces of the oxide semiconductor layer 105 and the source electrode 106a and the drain electrode 106b is performed after the etching for forming the source electrode 106a and the drain electrode 106b is performed.

The treatment for removing impurities can be performed by a plasma treatment or a treatment with a solution. As the plasma treatment, an oxygen plasma treatment, a dinitrogen monoxide plasma treatment, or the like can be used. A rare gas (as a typical example thereof is argon) may be used in the plasma treatment.

Further, for the cleaning treatment with a solution, an alkaline solution such as a TMAH solution, water, or an acidic solution such as diluted hydrofluoric acid can be used. For example, in the case where a diluted hydrofluoric acid solution is used, 50 wt % hydrofluoric acid is diluted with water at a dilution factor of about $10^2$-fold to about $10^5$-fold, preferably about $10^3$-fold to about $10^5$-fold. That is, diluted hydrofluoric acid having a concentration of 0.5 wt % to $5 \times 10^{-4}$ wt %, preferably $5 \times 10^{-2}$ wt % to $5 \times 10^{-4}$ wt %, is used for the cleaning treatment. By the cleaning treatment, the above-described impurities attached to the exposed surface of the oxide semiconductor layer 105 can be removed.

Further, with the treatment for removing impurities with use of a diluted hydrofluoric acid solution, the exposed surface of the oxide semiconductor layer 105 can be etched. That is, impurities attached to the exposed surface of the oxide semiconductor layer 105 or impurities entering the vicinity of the surface of the oxide semiconductor layer 105 can be removed together with part of the oxide semiconductor layer 105. Accordingly, the thickness of a region of the oxide semiconductor layer 105 which overlaps with either the source electrode 106a or the drain electrode 106b is greater than that of a region of the oxide semiconductor layer 105 which overlaps with neither the source electrode 106a nor the drain electrode 106b.

By performing the treatment for removing impurities, the chlorine concentration at the surface of the oxide semiconductor layer can be reduced to be less than or equal to $1 \times 10^{19}/cm^3$ (preferably less than or equal to $5 \times 10^{18}/cm^3$, further preferably less than or equal to $1 \times 10^{18}/cm^3$) in its concentration peak according to SIMS measurement. The boron concentration can be reduced to be less than or equal to $1 \times 10^{19}/cm^3$ (preferably less than or equal to $5 \times 10^{18}/cm^3$, further preferably less than or equal to $1 \times 10^{18}/cm^3$). The aluminum concentration can be reduced to be less than or equal to $1 \times 10^{19}/cm^3$ (preferably less than or equal to $5 \times 10^{18}/cm^3$, further preferably less than or equal to $1 \times 10^{18}/cm^3$).

The treatment for removing impurities enables the highly reliable transistor 150 having stable electric characteristics to be achieved.

Figure 3A:
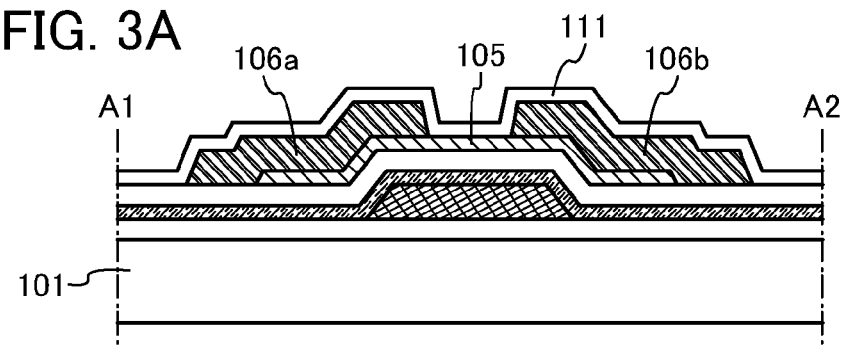
FIGS. 3A to 3D are cross-sectional views illustrating one embodiment of a method for manufacturing a semiconductor device.

Next, an insulating layer 111 with a thickness of 20 nm to 50 nm which is in contact with part of the oxide semiconductor layer 105 is formed over the source electrode 106a and the drain electrode 106b (see FIG. 3A). The insulating layer 111 can be formed using a material and a method similar to those of the insulating layer 102 or the gate insulating layer 104. For example, a silicon oxide film or a silicon oxynitride film can be formed to be the insulating layer 107 by a sputtering method or a CVD method.

In this embodiment, as the insulating layer 111, a 30-nm-thick silicon oxynitride film is formed by a plasma CVD method. The deposition conditions of the insulating layer 111 may be as follows: the gas flow rate ratio of $SiH_4$ to $N_2O$ is 20 sccm:3000 sccm; the pressure is 40 Pa; the RF power supply (power supply output) is 100 W; and the substrate temperature is 350° C.

Figure 3B:
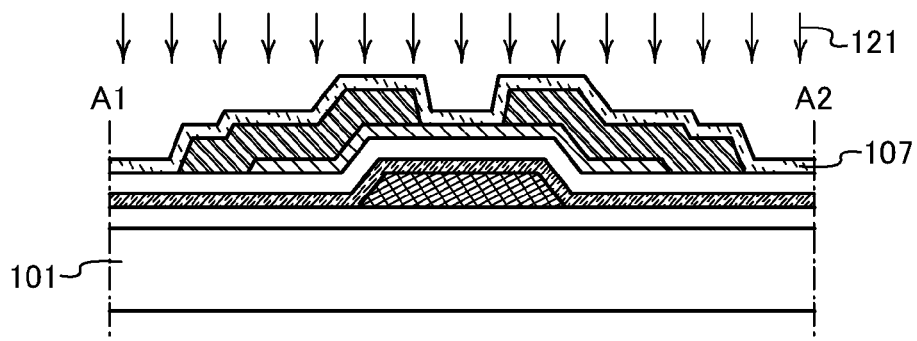

Next, oxygen 121 is introduced into the insulating layer 111, whereby the insulating layer 111 is made to be the insulating layer 107 which contains excessive oxygen (see FIG. 3B). At least one of an oxygen radical, ozone, an oxygen atom, and an oxygen ion (including a molecular ion and a cluster ion) is contained in the oxygen 121. The introduction of the oxygen 121 can be performed by an oxygen doping treatment.

The introduction of the oxygen 121 may be performed on the entire surface of the insulating layer 111 by one step, for example, using a linear ion beam. In the case of using the linear ion beam, the substrate 101 or the ion beam is relatively moved (scanned), whereby the oxygen 121 can be introduced into the entire surface of the insulating layer 111.

As a gas for supplying the oxygen 121, a gas containing an oxygen atom may be used; for example, an $O_2$ gas, an $N_2O$ gas, a $CO_2$ gas, a CO gas, or an $NO_2$ gas can be used. A rare gas (e.g., Ar) may be contained in the gas for supplying the oxygen.

Further, in the case where an ion implantation method is used for introducing the oxygen, the dose of the oxygen 121 is preferably greater than or equal to $1\times10^{13}$ ions/cm$^2$ and less than or equal to $5\times10^{16}$ ions/cm$^2$. The content of oxygen in the insulating layer 107 preferably exceeds that of the stoichiometric composition. Such a region containing oxygen in excess of the stoichiometric composition exists in at least part of the insulating layer 107. The depth at which oxygen is implanted may be adjusted as appropriate by implantation conditions.

In this embodiment, the oxygen 121 is introduced by a plasma treatment under an oxygen atmosphere. Note that the insulating layer 107 preferably contains impurities such as water or hydrogen as little as possible because it is an insulating layer in contact with the oxide semiconductor layer 105. Therefore, it is preferable to perform a heat treatment for decreasing hydrogen (including water or a hydroxyl group) in the insulating layer 111 before the introduction of the oxygen 121. The temperature of the heat treatment for dehydration or dehydrogenation is higher than or equal to 300° C. and lower than or equal to 700° C., or lower than the strain point of the substrate. The heat treatment for dehydration or dehydrogenation can be performed in a manner similar to that of the above-described heat treatment.

The plasma treatment for introducing the oxygen 121 (oxygen plasma treatment) is performed under conditions in which the oxygen flow rate is 250 sccm, the ICP power source is 0 W, the bias power is 4500 W, and the pressure is 15 Pa. Part of oxygen introduced into the insulating layer 111 by the oxygen plasma treatment is introduced into the oxide semiconductor layer 105 through the insulating layer 111. Owing to the introduction of oxygen into the oxide semiconductor layer 105 through the insulating layer 111, plasma damage on the surface of the oxide semiconductor layer 105 can be attenuated, whereby the reliability of the semiconductor device can be improved. It is preferable that the insulating layer 111 be thicker than 10 nm and thinner than 100 nm. If the thickness of the insulating layer 111 be less than or equal to 10 nm, the oxide semiconductor layer 105 is likely to be damaged by the oxygen plasma treatment.

On the other hand, if the thickness of the insulating layer 111 be greater than or equal to 100 nm, oxygen introduced by the oxygen plasma treatment might not be supplied sufficiently to the oxide semiconductor layer 105. The heat treatment for dehydration or dehydrogenation of the insulating layer 111 and/or the introduction of the oxygen 121 may be performed plural times. The introduction of oxygen into the insulating layer 111 enables the insulating layer 107 to serve as an oxygen supply layer.

Figure 3C:
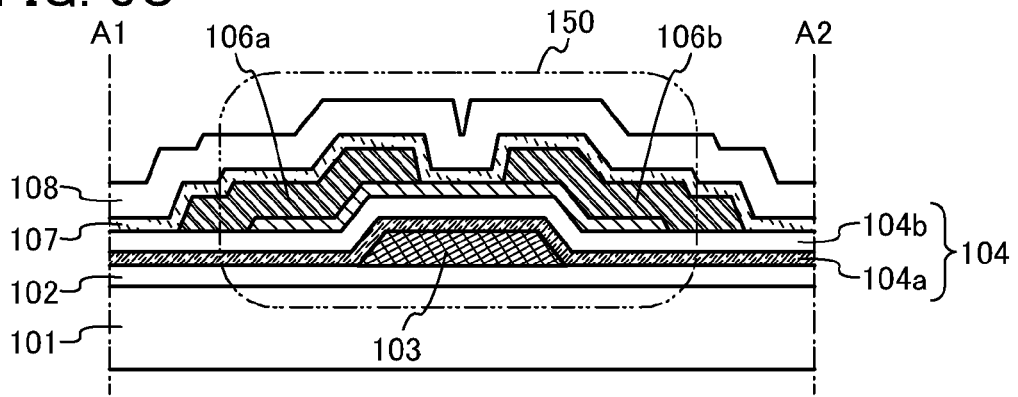
Figure 3D:
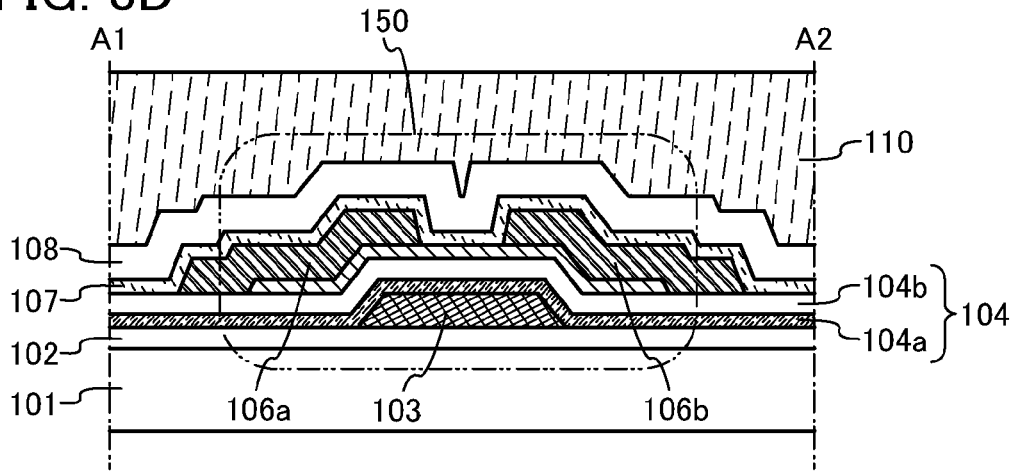

Next, the insulating layer 108 is formed to have a thickness of 200 nm to 500 nm over the insulating layer 107 (see FIG. 3C). The insulating layer 108 can be formed using a material and a method similar to those of the insulating layer 102 or the gate insulating layer 104. For example, a silicon oxide film or a silicon oxynitride film can be formed as the insulating layer 108 by a sputtering method or a CVD method.

In this embodiment, as the insulating layer 108, a 370-nm-thick silicon oxynitride film is formed by a plasma CVD method. The deposition conditions of the insulating layer 108 may be as follows: the gas flow rate ratio of $SiH_4$ to $N_2O$ is 30 sccm:4000 sccm; the pressure is 200 Pa; the RF power supply (power supply output) is 150 W; and the substrate temperature is 220° C.

After the formation of the insulating layer 108, a heat treatment may be performed thereon under an inert gas atmosphere, an oxygen atmosphere, or an atmosphere of a mixture of an inert gas and oxygen at a temperature higher than or equal to 250° C. and lower than or equal to 650° C., preferably higher than or equal to 300° C. and lower than or equal to 600° C. By this heat treatment, oxygen included in the insulating layer 107 can be supplied to the oxide semiconductor layer 105, so that oxygen vacancies in the oxide semiconductor layer 105 can be filled. The formation of the insulating layer 107 over the insulating layer 108 enables oxygen included in the insulating layer 107 to be supplied efficiently to the oxide semiconductor layer 105.

Further, an oxygen doping treatment may be performed on the insulating layer 108 to introduce the oxygen 121 into the insulating layer 108, whereby the insulating layer 108 is made an oxygen-excess state. The introduction of the oxygen 121 into the insulating layer 108 may be performed in a manner similar to that of the introduction of the oxygen 121 into the insulating layer 107. After the introduction of the oxygen 121 into the insulating layer 108, a heat treatment may be performed thereon under an inert gas atmosphere, an oxygen atmosphere, or an atmosphere of a mixture of an inert gas and oxygen at a temperature higher than or equal to 250° C. and lower than or equal to 650° C., preferably higher than or equal to 300° C. and lower than or equal to 600° C.

Figure 11A:
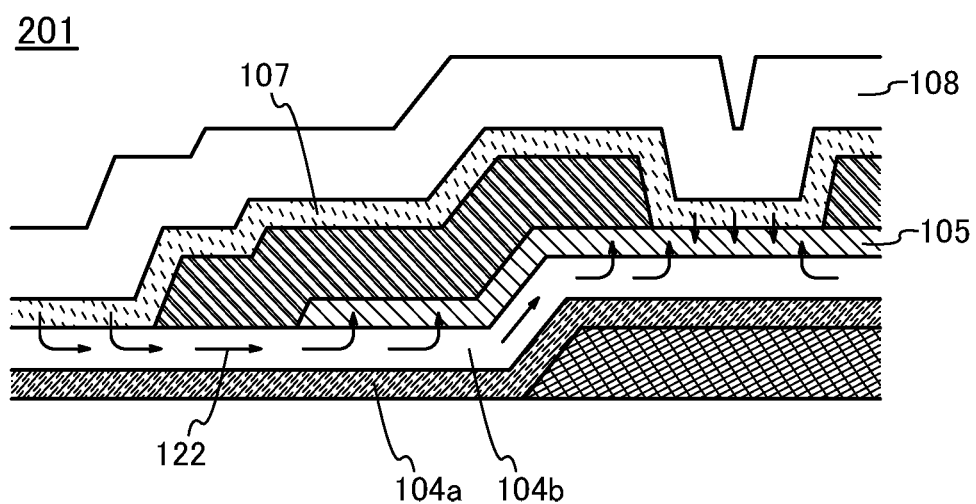
FIGS. 11A and 11B are cross-sectional views illustrating one embodiment of a semiconductor device.
Figure 11B:
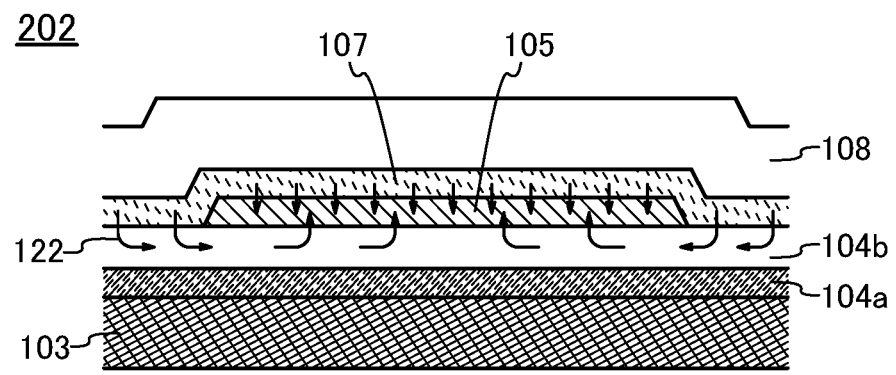

FIG. 11A is an enlarged view of a portion 201 illustrated in FIG. 1B, and FIG. 11B is an enlarged view of a portion 202 illustrated in FIG. 1C. An arrow in FIGS. 11A and 11B denotes supply of an oxygen 122 included in the insulating layer 107 to the oxide semiconductor layer 105. The oxygen 122 included in the insulating layer 107 is supplied not only directly to the oxide semiconductor layer 105 in the region where the oxide semiconductor layer 105 is in contact with the insulating layer 107 but also indirectly to the oxide semiconductor layer 105 through the gate insulating layer 104b. Further, in the case where the insulating layer 108 or the gate insulating layer 104b is an oxygen-excess state, oxygen included in the insulating layer 108 or the gate insulating layer 104b can also be supplied to the oxide semiconductor layer 105.

Through the above process, the transistor 150 in this embodiment is formed. An insulating layer may be further formed over the transistor 150. Described in this embodiment is an example in which a planarization insulating layer 110 is formed over the transistor 150 (see FIG. 3D). The planarization insulating layer 110 can be formed using a heat-resistant organic material such as polyimide, an acrylic resin, polyimide amide, a benzocyclobutene-based resin, polyamide, or an epoxy resin. As well as such organic materials, a low-dielectric constant material (a low-k material), a siloxane-based resin, PSG (phosphosilicate glass), BPSG (borophosphosilicate glass), or the like can be used. The planarization insulating layer 110 may be formed by stacking a plurality of insulating layers formed using these materials.

In a transistor using an oxide semiconductor for its semiconductor layer in which a channel is formed, the interface state density between the oxide semiconductor layer and the insulating layer can be reduced by supplying oxygen into the oxide semiconductor layer. As a result, carrier trapping at the interface between the oxide semiconductor layer and the insulating layer, caused by the operation of the transistor or the like, can be suppressed, and thus, a highly reliable transistor can be obtained.

Further, a carrier may be generated due to oxygen vacancies in the oxide semiconductor layer. In general, oxygen vacancies in the oxide semiconductor layer cause generation of electrons which are carriers in the oxide semiconductor layer. As a result, the threshold voltage of the transistor shifts in the negative direction. By sufficiently supplying oxygen to the oxide semiconductor layer preferably so that the oxide semiconductor layer contains excess oxygen, the density of oxygen vacancies in the oxide semiconductor layer can be reduced.

The oxide semiconductor layer 105 may be formed of a stacked layer of a plurality of oxide semiconductor layers. For example, the oxide semiconductor layer 105 may be a stacked layer of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using three-component metal oxides.

Further, the constituent elements of the first oxide semiconductor layer and the second oxide semiconductor layer may be the same as each other but the composition of the constituent elements of the first oxide semiconductor layer and the second oxide semiconductor layer may be different from each other. For example, the ratio of the number of atoms in the first oxide semiconductor layer may be In:Ga:Zn=1:1:1, and the ratio of the number of atoms in the second oxide semiconductor layer may be In:Ga:Zn=3:1:2. Alternatively, the ratio of the number of atoms in the first oxide semiconductor layer may be In:Ga:Zn=1:3:2, and the ratio of the number of atoms in the second oxide semiconductor layer may be In:Ga:Zn=2:1:3.

At this time, one of the first oxide semiconductor layer and the second oxide semiconductor layer, which is closer to the gate electrode (on a channel side), preferably contains In and Ga at a proportion of In>Ga. The other which is farther from the gate electrode (on a back channel side) preferably contains In and Ga at a proportion of In $\leq$ Ga.

In an oxide semiconductor, the s orbital of heavy metal mainly contributes to carrier transfer, and as the In content in the oxide semiconductor is increased, overlap of the s orbital tends to increase. Therefore, an oxide having a composition of In>Ga has higher mobility than an oxide having a composition of In$\leq$Ga. Further, in Ga, the formation energy of an oxygen vacancy is larger and thus an oxygen vacancy is less likely to occur than in In; therefore, the oxide having a composition of In$\leq$Ga has more stable characteristics than the oxide having a composition of In>Ga.

Application of an oxide semiconductor containing In and Ga at a proportion of In>Ga on a channel side, and an oxide semiconductor containing In and Ga at a proportion of In$\leq$Ga on a back channel side allows the mobility and reliability of the transistor to be further improved.

Further, oxide semiconductors whose crystallinities are different from each other may be applied to the first and second oxide semiconductor layers. That is, two of a single crystal oxide semiconductor, a polycrystalline oxide semiconductor, an amorphous oxide semiconductor, and a CAAC-OS may be combined as appropriate. By applying an amorphous oxide semiconductor to at least one of the first oxide semiconductor layer and the second oxide semiconductor layer, internal stress or external stress of the oxide semiconductor layer 105 can be relieved, variation in characteristics of the transistor is reduced, and reliability of the transistor can be further improved.

On the other hand, the amorphous oxide semiconductor is likely to absorb impurities such as hydrogen which generate donors, and is likely to generate oxygen vacancies are likely to be generated, so that amorphous oxide semiconductor is likely to be made n-type. For this reason, it is preferable to apply an oxide semiconductor having the crystallinity such as a CAAC-OS to the oxide semiconductor layer on the channel side.

Further, in a bottom-gate transistor of a channel etch type, oxygen vacancies are likely to be generated by an etching treatment for forming the source electrode and the drain electrode to make the transistor n-type, in the case where an amorphous oxide semiconductor is used on the back channel side. Therefore, in the case of the transistor of a channel etch type, it is preferable to apply an oxide semiconductor having the crystallinity to the oxide semiconductor layer on the back channel side.

Further, the oxide semiconductor layer 105 may have a stacked-layer structure consisting of three or more layers in which an amorphous oxide semiconductor layer is interposed between a plurality of oxide semiconductor layers each having the crystallinity. A structure in which an oxide semiconductor layer having the crystallinity and an amorphous oxide semiconductor layer are alternatively stacked may also be employed.

These two structures each used so that the oxide semiconductor layer 105 has a stacked-layer structure consisting of a plurality of layers can be combined as appropriate.

Further, in the case where the oxide semiconductor layer 105 has a stacked-layer structure consisting of a plurality of layers, an oxygen doping treatment may be performed after each formation of each of the oxide semiconductor layers. Such an oxygen doping treatment each time each oxide semiconductor layer is formed leads to an improvement of the effect of reducing oxygen vacancies in the oxide semiconductor.

This embodiment can be implemented in appropriate combination with any structure described in the other embodiments.

(Embodiment 2)

In this embodiment, a transistor 160 and a transistor 170 which have different structures from the structure of the transistor 150 are described.

The transistor 160 shown in FIG. 4C is different from the transistor 150 in that an insulating layer 109 is formed instead of the insulating layer 108 in the transistor 150. The transistor 160 can be formed in the following manner. First, the elements up to and including the insulating layer 107 are formed in a manner similar to that of the transistor 150, the oxygen 121 is introduced into the insulating layer 107, and then a metal layer 119 is formed over the insulating layer 107 (see FIG. 4A). In this embodiment, aluminum is used for the metal layer 119.

The metal layer 119 is preferably formed by a sputtering method, an evaporation method, a CVD method, or the like. The thickness of the metal layer 119 is preferably greater than or equal to 3 nm and less than or equal to 10 nm. In this embodiment, a 5-nm-thick aluminum film is formed.

The metal layer 119 formed over the insulating layer 107 is formed using a material which is made a metal oxide layer (the insulating layer 109) by introducing oxygen thereto to serve as a barrier layer of the transistor. As the metal oxide layer, a material having barrier properties, i.e., having a high shielding effect (blocking effect) of preventing penetration of both oxygen and impurities such as hydrogen or moisture into the transistor, can be used. As a metal material used for the metal oxide layer, as well as aluminum, aluminum to which magnesium is added, aluminum to which titanium is added, a stack of aluminum in contact with the insulating layer 107 and magnesium in contact with the aluminum, a stack of aluminum in contact with the insulating layer 107 and titanium in contact with the aluminum, or the like can be used.

Next, the oxygen 121 is introduced into the metal layer 119. The introduction of the oxygen 121 can be performed by an oxygen doping treatment. In this embodiment, the introduction of the oxygen 121 is performed by a plasma treatment under an oxygen atmosphere. Accordingly, the insulating layer 109 which is an oxide of the metal layer 119 is formed (see FIG. 4B).

The insulating layer 109 formed by the oxygen doping treatment does not necessarily contain oxygen equivalent to the stoichiometric composition and may have some conductivity. For example, in the case of aluminum oxide represented by $Al_2O_x$, x is preferably greater than or equal to 1 and less than or equal to 3.5. Further, in the case where the aluminum oxide has conductivity, the resistivity ρ is preferably greater than or equal to $1 \times 10^{10}$ Ω·m and less than or equal to $1 \times 10^{19}$ Ω·m, further preferably greater than or equal to $1 \times 10^{10}$ Ω·m and less than or equal to $1 \times 10^{18}$ Ω·m, still further preferably greater than or equal to $1 \times 10^{11}$ Ω·m and less than or equal to $1 \times 10^{15}$ Ω·m. The resistivity in the above range of the aluminum oxide leads to prevention of electrostatic breakdown of the transistor.

A heat treatment may be performed after the insulating layer 109 is formed. The temperature of the heat treatment can be, for example, higher than or equal to 250° C. and lower than or equal to 600° C., preferably higher than or equal to 300° C. and lower than or equal to 600° C.

Through the above process, the transistor 160 is formed. An insulating layer may be formed over the transistor 160. In this embodiment, an example in which the planarization insulating layer 110 is formed over the transistor 160 is described (see FIG. 4D).

Figure 5A:
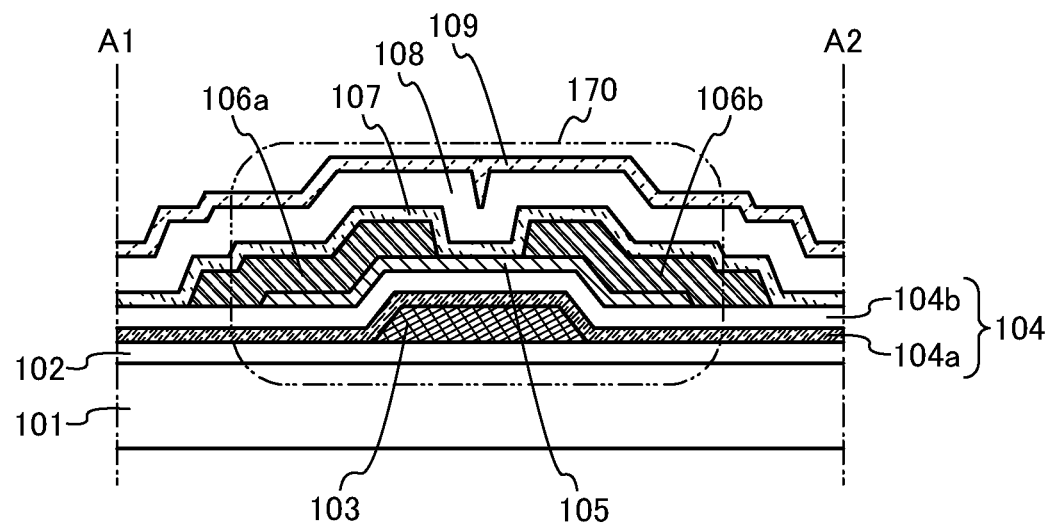
FIGS. 5A and 5B are cross-sectional views illustrating one embodiment of a semiconductor device.
Figure 5B:
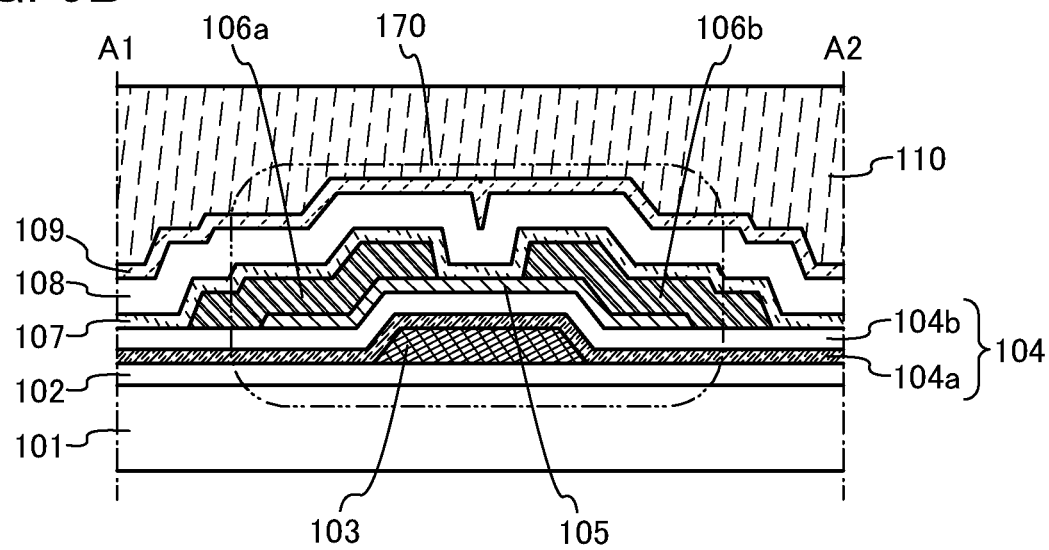

The transistor 170 illustrated in FIGS. 5A and 5B has a structure in which the insulating layer 109 is formed over the insulating layer 108 in the transistor 150. The insulating layer 109 can be formed in a manner similar to that of the insulating layer 109 in the transistor 160.

A constituent metal element of the insulating layer 109 (or metal layer 119) may serve as an impurity element which makes the oxide semiconductor layer 105 n-type, and therefore, it is preferable to form the insulating layer 109 not to be in contact with the oxide semiconductor layer 105. As shown in the transistor 170, the insulating layer 109 is preferably formed as far as possible from the oxide semiconductor layer 105.

The insulating layer 102 and/or the gate insulating layer 104a, and the insulating layer 108 and/or the insulating layer 109 are preferably formed using materials having barrier properties against oxygen and impurities such as hydrogen, moisture, a hydride, and a hydroxide. By employing the materials having barrier properties for the above-described insulating layers such that the oxide semiconductor layer 105 is interposed or enclosed by the layers having barrier properties, not only entrance of impurities from the outside but also elimination of oxygen from the oxide semiconductor layer 105, the insulating layer 107, and the gate insulating layer 104b can be prevented.

This embodiment can be implemented in appropriate combination with any structure described in the other embodiments.

(Embodiment 3)

A semiconductor device (also referred to as display device) having a display function can be manufactured using the transistor examples of which are described in the above embodiments. Moreover, part or all of the driver circuitry which includes the transistor can be formed over a substrate where the pixel portion is formed, whereby a system-on-panel can be obtained. In this embodiment, an example of a display device using the transistor whose examples are described in the above embodiments is described with reference to FIGS. 6A to 6C and FIGS. 7A and 7B. FIGS. 7A and 7B are cross-sectional views illustrating cross-sectional structures taken along a chain line M-N in FIG. 6B.

Figure 6A:
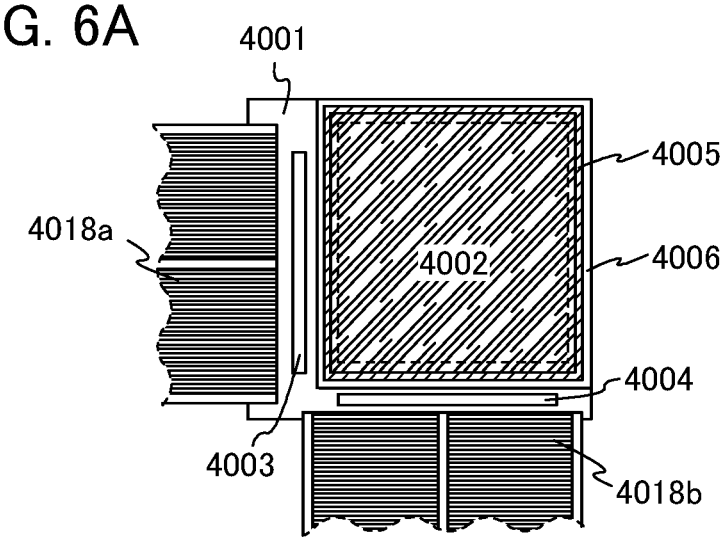
FIGS. 6A to 6C are plan views each illustrating one embodiment of a semiconductor device.

In FIG. 6A, a sealant 4005 is provided to surround a pixel portion 4002 provided over a first substrate 4001, and the pixel portion 4002 is sealed using a second substrate 4006. In FIG. 6A, a scan line driver circuit 4004 and a signal line driver circuit 4003 each are formed using a single-crystal semiconductor or a polycrystalline semiconductor over a substrate prepared separately, and mounted in a region different from the region surrounded by the sealant 4005 over the first substrate 4001. Further, a variety of signals and potentials are supplied to the signal line driver circuit 4003, the scan line driver circuit 4004, and the pixel portion 4002 from flexible printed circuits (FPCs) 4018a and 4018b.

Figure 6B:
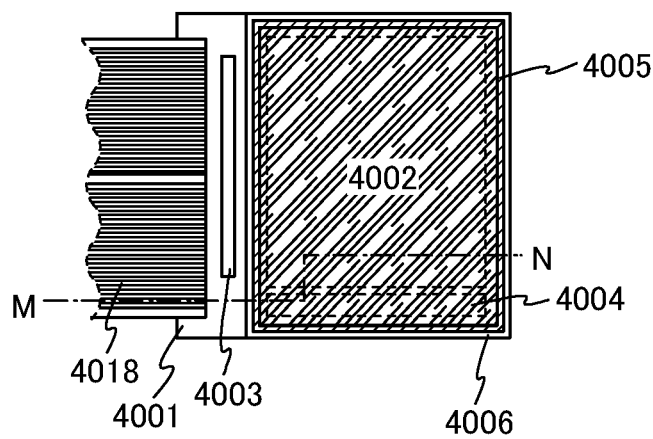
Figure 6C:
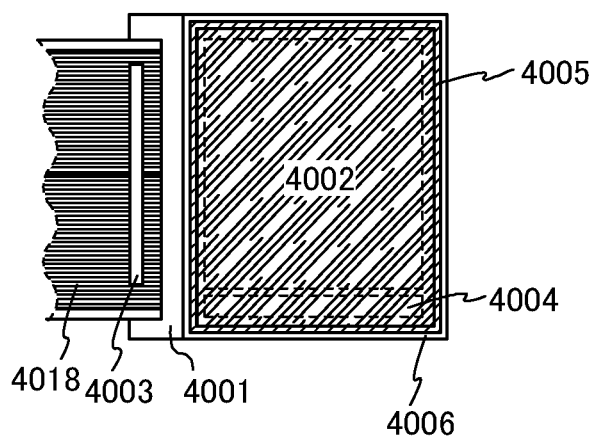

In FIGS. 6B and 6C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 6B and 6C, the signal line driver circuit 4003 which is formed using a single-crystal semiconductor or a polycrystalline semiconductor over a substrate separately prepared is mounted in a region different from the region surrounded by the sealant 4005 over the first substrate 4001. In FIGS. 6B and 6C, a variety of signals and potentials are supplied to the signal line driver circuit 4003, the scan line driver circuit 4004, and the pixel portion 4002 from an FPC 4018.

Although FIGS. 6B and 6C each illustrate the example in which the signal line driver circuit 4003 is formed separately and mounted over the first substrate 4001, embodiments of the present invention are not limited to this structure. The scan line driver circuit may be separately formed and then mounted, or only part of the signal line driver circuit or part of the scan line driver circuit may be separately formed and then mounted.

The connection method of such a separately formed driver circuit is not particularly limited; a chip on glass (COG) method, a wire bonding method, a tape automated bonding (TAB) method, or the like can be used. FIG. 6A illustrates an example in which the signal line driver circuit 4003 and the scan line driver circuit 4004 are mounted by a COG method; FIG. 6B illustrates an example in which the signal line driver circuit 4003 is mounted by a COG method; and FIG. 6C illustrates an example in which the signal line driver circuit 4003 is mounted by a TAB method.

Further, the display device includes in its category, a panel in which the display element is sealed and a module in which an IC including a controller or the like is mounted over the panel.

The display device in this specification means an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted over the display element by a COG method.

The pixel portion and the scan line driver circuit provided over the first substrate include a plurality of transistors and any of the transistors which are described in the above embodiments can be applied thereto.

As the display element provided in the display device, a liquid crystal element (also referred to as liquid crystal display element) or a light-emitting element (also referred to as light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

As illustrated in FIGS. 7A and 7B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed of the same conductive layer as a first electrode layer 4030. The terminal electrode 4016 is formed of the same conductive film as a source electrode and a drain electrode of a transistor 4010, 4011.

The pixel portion 4002 and the scan line driver circuit 4004 which are provided over the first substrate 4001 include a plurality of transistors. FIGS. 7A and 7B illustrate the transistor 4010 included in the pixel portion 4002 and the transistor 4011 included in the scan line driver circuit 4004 as an example. In FIG. 7A, an insulating layer 4020 is provided over the transistors 4010 and 4011. In FIG. 7B, a planarization layer 4021 is further provided over an insulating layer 4024. An insulating layer 4023 is an insulating layer serving as a base layer.

In this embodiment, any of the transistors described in the above embodiments can be applied to the transistor 4010 or 4011.

A change in the electric characteristics of each of the transistors described in the above embodiments is suppressed and thus the transistors are electrically stable. Accordingly, a semiconductor device with high reliability can be provided as any of the semiconductor devices illustrated in FIGS. 7A and 7B.

FIG. 7B illustrates an example in which a conductive layer 4017 is provided over the insulating layer 4024 so as to overlap with a channel formation region of the oxide semiconductor layer of the transistor 4011 for the driver circuit. In this embodiment, the conductive layer 4017 is formed of the same layer as the first electrode layer 4030. The conductive layer 4017 is provided at the position overlapping with the channel formation region of the oxide semiconductor layer, whereby the amount of change in the threshold voltage of the transistor 4011 by a BT test can be further reduced. The potential applied to the conductive layer 4017 is either the same as or different from the potential applied to the gate electrode of the transistor 4011, and the conductive layer 4017 can function as a second gate electrode. The potential of the conductive layer 4017 may be GND, 0 V, or in a floating state.

In addition, the conductive layer 4017 has a function of blocking an external electric field. In other words, the conductive layer 4017 has a function of preventing an external electric field (particularly, a function of preventing static electricity) from affecting the inside (a circuit portion including a thin film transistor). The blocking function of the conductive layer 4017 can prevent a change in electric characteristics of the transistor due to the effect of external electric field such as static electricity. The conductive layer 4017 can be used for any of the transistors described in the above embodiments.

The transistor 4010 included in the pixel portion 4002 is electrically connected to the display element in the display panel. There is no particular limitation on the kind of the display element as long as display can be performed; various kinds of display elements can be employed.

An example of a liquid crystal display device using a liquid crystal element as a display element is illustrated in FIG. 7A. In FIG. 7A, a liquid crystal element 4013 which is a display element includes the first electrode layer 4030, a second electrode layer 4031, and a liquid crystal layer 4008. Insulating layers 4032 and 4033 serving as alignment films are provided so that the liquid crystal layer 4008 is interposed therebetween. The second electrode layer 4031 is provided on the second substrate 4006 side. The second electrode layer 4031 overlaps with the first electrode layer 4030 with the liquid crystal layer 4008 interposed therebetween.

A spacer 4035 is a columnar spacer obtained by selective etching of an insulating layer and is provided in order to control the distance between the first electrode layer 4030 and the second electrode layer 4031 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. The above liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. The blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt.% or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor that uses an oxide semiconductor layer particularly has a possibility that electric characteristics of the transistor may change significantly by the influence of static electricity and deviate from the designed range. Therefore, it is more effective to use a liquid crystal material exhibiting a blue phase for the liquid crystal display device including the transistor using an oxide semiconductor layer.

The specific resistivity of the liquid crystal material is greater than or equal to $1 \times 10^9$ $\Omega \cdot cm$, preferably greater than or equal to $1 \times 10^{11}$ $\Omega \cdot cm$, further preferably greater than or equal to $1 \times 10^{12}$ $\Omega \cdot cm$. The specific resistance in this specification is measured at 20° C.

In the transistor used in this embodiment, which uses a highly-purified oxide semiconductor layer, the current in an off state (the off-state current) can be made small. Accordingly, an electrical signal such as an image signal can be retained for a long period, and thus a writing interval can be set long in a power-on state. Accordingly, frequency of refresh operation can be reduced, which leads to an effect of suppressing power consumption.

The size of storage capacitor formed in the liquid crystal display device is set considering the leakage current of the transistor provided in the pixel portion or the like so that charge can be held for a predetermined period. The size of the storage capacitor may be set considering the off-state current of the transistor or the like. Owing to the transistor using a high-purity oxide semiconductor layer, it is enough to provide a storage capacitor having a capacitance that is less than or equal to $1/3$, preferably less than or equal to $1/5$ of the liquid crystal capacitance of each pixel.

In the transistor using the above oxide semiconductor, relatively high field-effect mobility can be obtained, which enables high-speed operation. Therefore, application of the above transistor to the pixel portion of the semiconductor device having a display function enables high-quality images to be displayed. In addition, the driver circuitry and the pixel portion can be formed separately over one substrate, whereby the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may also be employed. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an Advanced Super View (ASV) mode, or the like can be used. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained with a polarizing substrate and a retardation substrate. In addition, a backlight, a side light, or the like may be used as a light source.

As the display method in the pixel portion, a progressive method, an interlace method, or the like can be employed. Further, color elements controlled in the pixel for color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to a display device for color display but can also be applied to a display device for monochrome display.

Alternatively, as the display element included in the display device, a light-emitting element utilizing electroluminescence can be used. Light-emitting elements utilizing electroluminescence are classified according to whether the light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from its pair of electrodes into the layer containing a light-emitting organic compound, and current flows. The carriers (electrons and holes) are recombined, and thus, the light-emitting organic compound is excited; the light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An example in which the organic EL element is used as the light-emitting element is described here.

To extract light emitted from the light-emitting element, at least one of the pair of electrodes is transparent. The light-emitting element can have a top emission structure in which light emission is extracted through the surface on the side opposite to the substrate; a bottom emission structure in which light emission is extracted through the surface on the substrate side; or a dual emission structure in which light emission is extracted through the surface on the side opposite to the substrate and the surface on the substrate side. A light-emitting element having any of these emission structures can be used.

FIG. 7B illustrates an example of a light-emitting device in which a light-emitting element is used as a display element. A light-emitting element 4513 which is a display element is electrically connected to the transistor 4010 provided in the pixel portion 4002. The structure of the light-emitting element 4513 is not limited to a stacked-layer structure illustrated in FIG. 7B, which includes the first electrode layer 4030, an electroluminescent layer 4511, and the second electrode layer 4031. The structure of the light-emitting element 4513 can be changed as appropriate depending on the direction in which light is extracted from the light-emitting element 4513, or the like.

A bank 4510 can be formed using an organic insulating material or an inorganic insulating material. It is particularly preferable that the bank 4510 be formed using a photosensitive resin material to have an opening over the first electrode layer 4030 so that a sidewall of the opening is formed as a tilted surface with continuous curvature.

The electroluminescent layer 4511 is formed either of a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, as well as an inert gas such as nitrogen or argon, an ultraviolet curable resin or a thermosetting resin can be used; polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

Further, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions in the surface so as to reduce the glare can be performed.

The first electrode layer and the second electrode layer (each of which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, or an indium tin oxide to which a silicon oxide is added.

The first electrode layer 4030 and the second electrode layer 4031 each can be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); alloys thereof; and nitrides thereof.

A conductive composition containing a conductive high molecule (also referred to as conductive polymer) can also be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of aniline, pyrrole, and thiophene or a derivative thereof can be given.

Further, since the transistor is easily broken by static electricity or the like, a protection circuit for protecting the driver circuit is preferably provided. The protection circuit is preferably formed using a nonlinear element.

As described above, application of any of the transistors described in the above embodiments enables a highly reliable semiconductor device having a display function to be provided.

This embodiment can be implemented in appropriate combination with any structure described in the other embodiments.

(Embodiment 4)

A semiconductor device having an image sensor function for reading data of an object can be manufactured using any of the transistors described in the above embodiments.

Figure 8A:
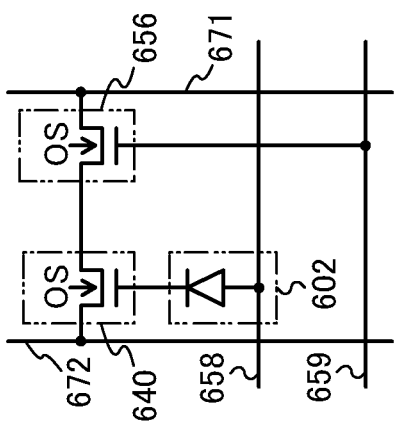
FIGS. 8A and 8B are a circuit diagram and a cross-sectional view illustrating one embodiment of a semiconductor device.

FIG. 8A shows an example of a semiconductor device having an image sensor function. FIG. 8A is an equivalent circuit of a photo sensor and FIG. 8B is a cross-sectional view showing part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

In the circuit diagram in this specification, a transistor using an oxide semiconductor layer is shown with a symbol "OS" for clear identification as a transistor using an oxide semiconductor layer. In FIG. 8A, the transistor 640 and the transistor 656 are transistors each using an oxide semiconductor for its semiconductor layer where a channel is formed, to which any of the transistors described in the above embodiments can be applied. In this embodiment, an example in which a transistor having a structure similar to that of the transistor 150 described in Embodiment 1 is used is described. The transistor 640 is a bottom-gate, inverted staggered transistor in which an insulating layer functioning as a channel protective layer is provided over an oxide semiconductor layer.

Figure 8B:
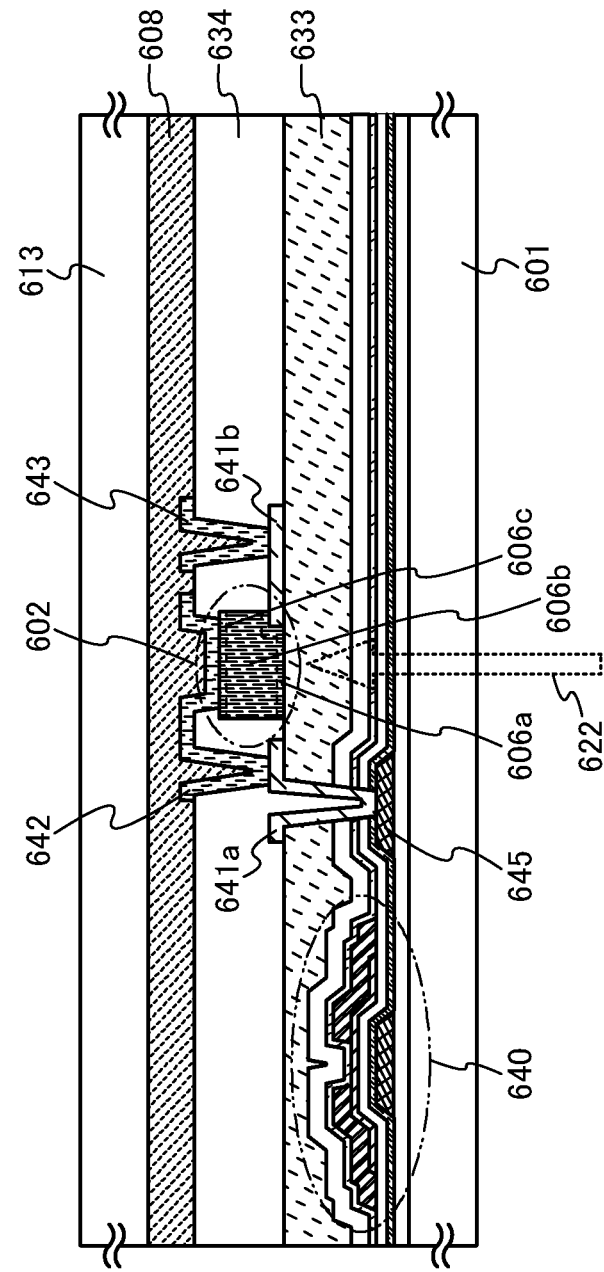

FIG. 8B is a cross-sectional view illustrating structure examples of the photodiode 602 and the transistor 640 in the photo sensor. The photodiode 602 functioning as a sensor and the transistor 640 are provided over a substrate 601 having an insulating surface (TFT substrate). A substrate 613 is provided over the photodiode 602 and the transistor 640 with an adhesive layer 608 interposed therebetween.

An insulating layer 633 and an insulating layer 634 are provided over the transistor 640. The photodiode 602 is provided over the insulating layer 633. In the photodiode 602, a first semiconductor layer 606a, a second semiconductor layer 606b, and a third semiconductor layer 606c are sequentially stacked from the insulating layer 633 side between an electrode layer 642 provided over the insulating layer 634 and each of electrodes 641a and 641b formed over the insulating layer 633.

The electrode 641b is electrically connected to a conductive layer 643 formed over the insulating layer 634, and the electrode layer 642 is electrically connected to a conductive layer 645 through the electrode 641a. The conductive layer 645 is electrically connected to a gate electrode of the transistor 640, and the photodiode 602 is electrically connected to the transistor 640.

Here, a pin photodiode in which a semiconductor layer having a p-type conductivity as the first semiconductor layer 606a, a high-resistance semiconductor layer (i-type semiconductor layer) as the second semiconductor layer 606b, and a semiconductor layer having an n-type conductivity as the third semiconductor layer 606c are stacked is illustrated as an example.

The first semiconductor layer 606a is a p-type semiconductor layer and can be formed using amorphous silicon containing an impurity element imparting p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion implantation method. Heating or the like may be performed thereon after introducing the impurity element by an ion implantation method or the like in order to diffuse the impurity element. In this case, as the method of forming the amorphous silicon film, an LPCVD method, a vapor deposition method, a sputtering method, or the like may be employed. The first semiconductor layer 606a is preferably formed to have a thickness greater than or equal to 10 nm and less than or equal to 50 nm.

The second semiconductor layer 606b is an i-type semiconductor layer (intrinsic semiconductor layer) and is formed using amorphous silicon. As for formation of the second semiconductor layer 606b, an amorphous silicon film is formed with the use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be alternatively formed by an LPCVD method, a vapor film formation method, a sputtering method, or the like. The second semiconductor layer 606b is preferably formed to have a thickness greater than or equal to 200 nm and less than or equal to 1000 nm.

The third semiconductor layer 606c is an n-type semiconductor layer and is formed using amorphous silicon containing an impurity element imparting n-type conductivity. The third semiconductor layer 606c is formed by a plasma CVD method with use of a semiconductor source gas containing an impurity element belonging to Group 15 (such as phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion implantation method. Heating or the like may be performed thereon after introducing the impurity element by an ion implantation method or the like in order to diffuse the impurity element. In this case, as the method of forming the amorphous silicon film, an LPCVD method, a vapor deposition method, a sputtering method, or the like may be employed. The third semiconductor layer 606c is preferably formed to have a thickness greater than or equal to 20 nm and less than or equal to 200 nm.

The first semiconductor layer 606a, the second semiconductor layer 606b, and the third semiconductor layer 606c are not necessarily formed using an amorphous semiconductor; they may be formed using a polycrystalline semiconductor, a microcrystalline semiconductor, or a semi-amorphous semiconductor (SAS).

Further, since the mobility of holes generated by the photoelectric effect is lower than that of electrons, the pin photodiode has better characteristics when the surface on the p-type semiconductor layer side is used as a light-receiving surface. Here, an example where light 622 received by the photodiode 602 from a surface of the substrate 601, over which the pin photodiode is formed, is converted into electric signals is described. Light from the semiconductor layer side having a conductivity type opposite to that of the semiconductor layer side on the light-receiving surface is disturbance light; therefore, the electrode layer is preferably formed from a light-blocking conductive layer. The surface on the n-type semiconductor layer side can alternatively be used as the light-receiving surface.

For reduction of the surface roughness, an insulating layer functioning as a planarization layer is preferably used as each of the insulating layers 633 and 634. The insulating layers 633 and 634 can be formed using, for example, an organic insulating material having heat resistance such as polyimide, an acrylic resin, a benzocyclobutene resin, polyamide, or an epoxy resin. As well as such an organic insulating material, it is possible to use a single layer or a stacked layer of a low-dielectric constant material (a low-k material), a siloxane-based resin, phosphosilicate glass (PSG), borophosphosilicate glass (BPSG), or the like.

With detection of light that enters the photodiode 602, data on an object to be detected can be read. A light source such as a backlight can be used in order to read information on the object.

A change in the electric characteristics of any of the transistors described in the above embodiments is suppressed and thus the transistors are electrically stable. Thus, a highly reliable semiconductor device including the transistor 640 having stable electric characteristics can be provided. Further, the highly reliable semiconductor device can be manufactured at a high yield, whereby high productivity can be achieved.

This embodiment can be implemented in appropriate combination with any structure described in the other embodiments.

(Embodiment 5)

A semiconductor device disclosed in this specification can be applied to a variety of electronic devices (including game machines). Examples of the electronic devices are a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of such electronic devices are illustrated in FIGS. 9A to 9C and FIGS. 10A to 10C.

Figure 9A:
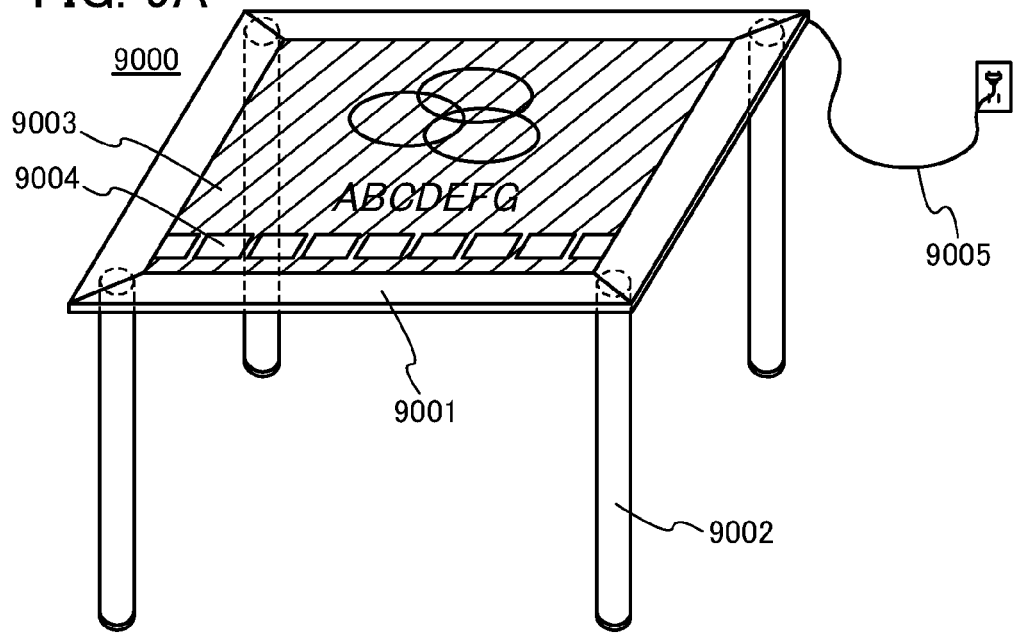
FIGS. 9A to 9C are views each illustrating an electronic device.

FIG. 9A illustrates a table 9000 having a display portion. In the table 9000, a display portion 9003 is incorporated in a housing 9001, and an image can be displayed on the display portion 9003. The housing 9001 is supported by four leg portions 9002. Further, a power cord 9005 for supplying power is provided for the housing 9001.

The semiconductor device described in any of Embodiments 1 to 4 can be used for the display portion 9003, so that the electronic device can have a high reliability.

The display portion 9003 has a touch-input function. When a user touches displayed buttons 9004 which are displayed on the display portion 9003 of the table 9000 with his/her finger or the like, the user can carry out operation of the screen and input of information. Further, the table may be configured to communicate with home appliances or control the home appliances, whereby the table 9000 may function as a control device which controls the home appliances by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television set. If a television set having a large screen is set in a small room, an open space is accordingly reduced; however, the display portion is incorporated in the table, a space in the room can be efficiently used.

Figure 9B:
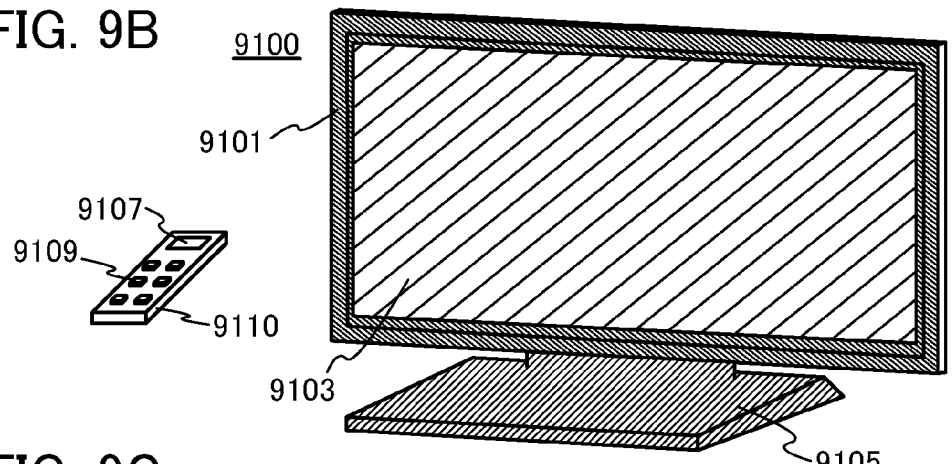

FIG. 9B illustrates a television set 9100. In the television set 9100, a display portion 9103 is incorporated in a housing 9101, and an image can be displayed on the display portion 9103. The housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Further, the remote controller 9110 may be provided with a display portion 9107 for displaying data output from the remote controller 9110.

The television set 9100 illustrated in FIG. 9B is provided with a receiver, a modem, and the like. With the use of the receiver, the television set 9100 can receive general TV broadcasts. Further, the television set 9100 can be connected to a communication network with or without wires via the modem, whereby one-way (from sender to receiver) or two-way (between sender and receiver or between receivers) data communication can be performed.

The semiconductor device described in any of Embodiments 1 to 4 can be used for the display portions 9103 and 9107, so that the television set and the remote controller can have a high reliability.

Figure 9C:
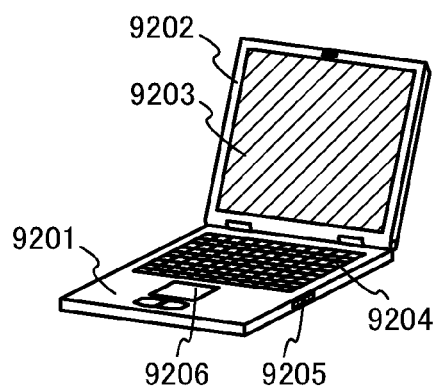

FIG. 9C illustrates a computer which includes a main body 9201, a housing 9202, a display portion 9203, a keyboard 9204, an external connection port 9205, a pointing device 9206, and the like. The computer includes a semiconductor device manufactured in accordance with one embodiment of the present invention for the display portion 9203. The semiconductor device described in any of the above embodiments can be used, so that the computer can have a high reliability.

Figure 10A:
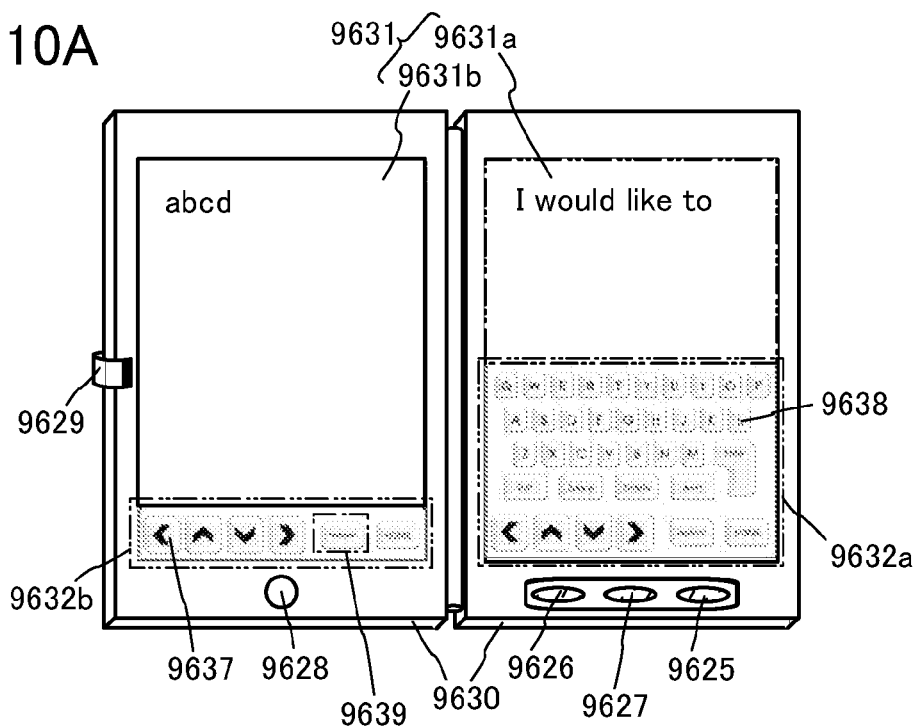
FIGS. 10A and 10B are views illustrating an electronic device.
Figure 10B:
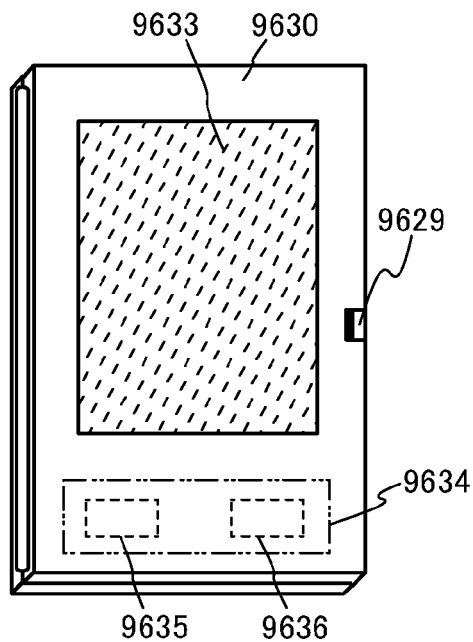

FIGS. 10A and 10B illustrate a tablet terminal that can be folded in two. In FIG. 10A, the tablet terminal is open (unfolded) and includes a housing 9630, a display portion 9631 including a display portion 9631a and a display portion 9631b, a switch 9626 for switching a display mode, a power switch 9627, a switch 9625 for switching to power-saving mode, a fastener 9629, and an operation switch 9628.

The semiconductor device described in any of Embodiments 1 to 4 can be used for the display portion 9631a and the display portion 9631b, so that the tablet terminal can have a high reliability.

Part of the display portion 9631a can be a touch panel region 9632a and data can be input by touching a displayed operation key 9638. FIG. 10A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. By touching the place where a button 9639 for switching to keyboard display with a finger, a stylus, or the like, keyboard buttons can be displayed on the display portion 9631b.

Touch input can be performed at the same time on the touch panel regions 9632a and 9632b.

The switch 9626 for switching a display mode allows switching between a landscape mode and a portrait mode, color display and black-and-white display, and the like. The switch 9625 for switching to power-saving mode can control display luminance to be optimal in accordance with the amount of external light in use of the tablet terminal which is detected by an optical sensor incorporated in the tablet terminal. The tablet terminal may include another detection device such as a sensor for detecting orientation (e.g., a gyroscope or an acceleration sensor) as well as the optical sensor.

Although FIG. 10A shows the example where the display area of the display portion 9631a is the same as that of the display portion 9631b, embodiments of the present invention are not limited thereto. They may differ in size and/or image quality. For example, one of them may be a display panel that can display higher-definition images than the other.

FIG. 10B illustrates the tablet terminal which is closed. The tablet terminal includes the housing 9630, a solar battery 9633, a charge/discharge control circuit 9634, a battery 9635, and a DCDC converter 9636. In FIG. 10B, as an example, the charge/discharge control circuit 9634 includes the battery 9635 and the DCDC converter 9636.

Since the tablet terminal can be folded into two, the housing 9630 can be closed when the tablet terminal is not in use. Thus, the display portions 9631a and 9631b can be protected, whereby a tablet terminal with high endurance and high reliability for long-term use can be provided.

The tablet terminal illustrated in FIGS. 10A and 10B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to the touch panel, the display portion, an image signal processor, and the like. Provision of the solar battery 9633 is preferable in that the battery 9635 can be provided on one or both surfaces of the housing 9630 and thereby the battery 9635 can be charged efficiently. A lithium ion battery can be used as the battery 9635; in that case, there is an advantage of downsizing or the like.

Figure 10C:
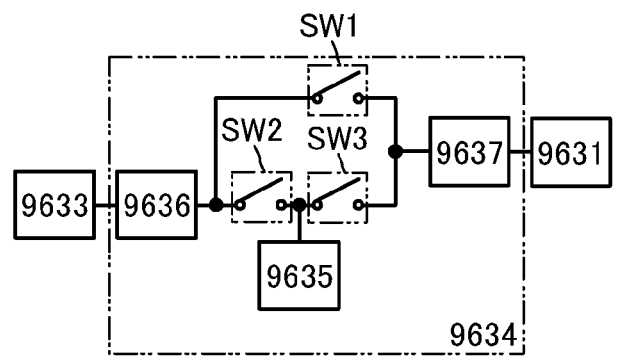
FIG. 10C is a block diagram illustrating a charge and discharge control circuit.

The structure and operation of the charge/discharge control circuit 9634 illustrated in FIG. 10B are described with reference to a block diagram in FIG. 10C. FIG. 10C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge/discharge control circuit 9634 illustrated in FIG. 10B.

First, an example of operation in the case where power is generated by the solar battery 9633 using external light is described. The voltage of power generated by the solar battery 9633 is raised or lowered by the DCDC converter 9636 to a voltage for charging the battery 9635. When the display portion 9631 is operated with the power from the solar battery 9633, the switch SW1 is turned on and the voltage of the power is raised or lowered by the converter 9637 to a voltage needed for operating the display portion 9631. On the other hand, when display on the display portion 9631 is not performed, the switch SW1 may be turned off and a switch SW2 may be turned on so that the battery 9635 is charged.

Here, the solar battery 9633 is shown as an example of a power generation means; however, there is no particular limitation on the way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

This embodiment can be implemented in appropriate combination with any structure described in the other embodiments.

EXPLANATION OF REFERENCE

101: substrate; 102: insulating layer; 103: gate electrode; 104: gate insulating layer; 105: oxide semiconductor layer; 107: insulating layer; 108: insulating layer; 109: insulating layer; 110: planarization insulating layer; 111: insulating layer; 115: oxide semiconductor layer; 117: conductive layer; 119: metal layer; 121: oxygen; 122: oxygen; 150: transistor; 160: transistor; 170: transistor; 201: portion; 202: portion; 601: substrate; 602: photodiode; 608: adhesive layer; 613: substrate; 622: light; 633: insulating layer; 634: insulating layer; 640: transistor; 642: electrode layer; 643: conductive layer; 645: conductive layer; 656: transistor; 658: photodiode reset signal line; 659: gate signal line; 671: photo sensor output signal line; 672: photo sensor reference signal line; 4001: substrate; 4002: pixel portion; 4003: signal line driver circuit; 4004: scan line driver circuit; 4005: sealant; 4006: substrate; 4008: liquid crystal layer; 4010: transistor; 4011: transistor; 4013: liquid crystal element; 4015: connection terminal electrode; 4016: terminal electrode; 4017: conductive layer; 4018: FPC; 4019: anisotropic conductive layer; 4020: insulating layer; 4021: planarization layer; 4023: insulating layer; 4024: insulating layer; 4030: electrode layer; 4031: electrode layer; 4032: insulating layer; 4033: insulating layer; 4035: spacer; 4510: bank; 4511: electroluminescent layer; 4513: light-emitting element; 4514: filler; 9000: table; 9001: housing; 9002: leg portion; 9003: display portion; 9004: displayed button; 9005: power cord; 9100: television set; 9101: housing; 9103: display portion; 9105: stand; 9107: display portion; 9109: operation key; 9110: remote controller; 9201: main body; 9202: housing; 9203: display portion; 9204: keyboard; 9205: external connection port; 9206: pointing device; 9625: switch; 9626: switch; 9627: power switch; 9628: operation switch; 9629: fastener; 9630: housing; 9631: display portion; 9633: solar battery; 9634: charge/discharge control circuit; 9635: battery; 9636: DCDC converter; 9637: converter; 9638: operation key; 9639: button; 104a: gate insulating layer; 104b: gate insulating layer; 106a: source electrode; 106b: drain electrode; 4018a: FPC; 4018b: FPC; 606a: semiconductor layer; 606b: semiconductor layer; 606c: semiconductor layer; 641a: electrode; 641b: electrode; 9631a: display portion; 9631b: display portion; 9632a: region; 9632b: region This application is based on Japanese Patent Application serial no. 2012-013451 filed with Japan Patent Office on Jan. 25, 2012, the entire contents of which are hereby incorporated by reference.

The invention claimed is:

1. A method for manufacturing a semiconductor device, comprising the steps of:
   - forming an oxide semiconductor layer containing In and Ga at a proportion of In>Ga;
   - etching a part of the oxide semiconductor layer by a wet etching method;
   - forming a silicon oxynitride film over the oxide semiconductor layer; and
   - introducing oxygen to the silicon oxynitride film by a plasma treatment under an oxygen atmosphere,
   - wherein a copper concentration in the oxide semiconductor layer is less than or equal to $1\times10^{18}$ atoms/cm$^3$.

2. The method for manufacturing the semiconductor device according to claim 1,
   wherein part of oxygen introduced into the silicon oxynitride film is introduced into the oxide semiconductor layer through the silicon oxynitride film.

3. The method for manufacturing the semiconductor device according to claim 1,
   wherein the oxide semiconductor layer contains In, Ga, and Zn with an atomic ratio of In:Ga:Zn=3/6:1/6:2/6 or in the neighborhood of In:Ga:Zn=3/6:1/6:2/6, and
   wherein an oxide semiconductor layer with an atomic ratio of In:Ga:Zn=A:B:C (A+B+C=1) and satisfying $(3/6-A)^2+(1/6-B)^2+(2/6-C)^2 \leq 0.0025$ is in the neighborhood of In:Ga:Zn=3/6:1/6:2/6.

4. The method for manufacturing the semiconductor device according to claim 1,
wherein the oxide semiconductor layer contains In, Ga, and Zn with an atomic ratio of In:Ga:Zn=2/6:1/6:3/6 or in the neighborhood of In:Ga:Zn=2/6:1/6:3/6, and
wherein an oxide semiconductor layer with an atomic ratio of In:Ga:Zn=A:B:C (A+B+C=1) and satisfying $(2/6-A)^2+(1/6-B)^2+(3/6-C)^2 \leq 0.0025$ is in the neighborhood of In:Ga:Zn=2/6:1/6:3/6.

5. The method for manufacturing the semiconductor device according to claim 1,
wherein the oxide semiconductor layer contains In and Ga at a proportion of In>2 Ga.

6. The method for manufacturing the semiconductor device according to claim 1, further comprising a step of:
forming a gate electrode with a stacked-layer structure including a first layer comprising a light-transmitting conductive material and a second layer comprising a metal element.

7. The method for manufacturing the semiconductor device according to claim 1,
wherein a hydrogen concentration in the silicon oxynitride film is less than $7.2 \times 10^{20}$ atoms/cm$^3$.

8. The method for manufacturing the semiconductor device according to claim 1,
wherein c-axes are aligned, and a-axes or b-axes are not macroscopically aligned in the oxide semiconductor layer.

9. The method for manufacturing the semiconductor device according to claim 1,
wherein the oxide semiconductor layer includes microcrystal with a size greater than or equal to 1 nm and less than 10 nm.

10. A method for manufacturing a semiconductor device, comprising the steps of:
forming a gate electrode;
forming an insulating layer over the gate electrode;
forming an oxide semiconductor layer over the insulating layer, the oxide semiconductor layer containing In and Ga at a proportion of In>Ga;
etching the oxide semiconductor layer by a wet etching method;
forming a silicon oxynitride film over the oxide semiconductor layer; and
introducing oxygen to the silicon oxynitride film by a plasma treatment under an oxygen atmosphere,
wherein a copper concentration in the oxide semiconductor layer is less than or equal to $1 \times 10^{18}$ atoms/cm$^3$.

11. The method for manufacturing the semiconductor device according to claim 10,
wherein part of oxygen introduced into the silicon oxynitride film is introduced into the oxide semiconductor layer through the silicon oxynitride film.

12. The method for manufacturing the semiconductor device according to claim 10,
wherein the oxide semiconductor layer contains In, Ga, and Zn with an atomic ratio of In:Ga:Zn=3/6:1/6:2/6 or in the neighborhood of In:Ga:Zn=3/6:1/6:2/6, and
wherein an oxide semiconductor layer with an atomic ratio of In:Ga:Zn=A:B:C (A+B+C=1) and satisfying $(3/6-A)^2+(1/6-B)^2+(2/6-C)^2 \leq 0.0025$ is in the neighborhood of In:Ga:Zn=3/6:1/6:2/6.

13. The method for manufacturing the semiconductor device according to claim 10,
wherein the oxide semiconductor layer contains In, Ga, and Zn with an atomic ratio of In:Ga:Zn=2/6:1/6:3/6 or in the neighborhood of In:Ga:Zn=2/6:1/6:3/6, and
wherein an oxide semiconductor layer with an atomic ratio of In:Ga:Zn=A:B:C (A+B+C=1) and satisfying $(2/6-A)^2+(1/6-B)^2+(3/6-C)^2 \leq 0.0025$ is in the neighborhood of In:Ga:Zn=2/6:1/6:3/6.

14. The method for manufacturing the semiconductor device according to claim 10,
wherein the oxide semiconductor layer contains In and Ga at a proportion of In>2 Ga.

15. The method for manufacturing the semiconductor device according to claim 10,
wherein the gate electrode is a stacked-layer structure including a first layer comprising a light-transmitting conductive material and a second layer comprising a metal element.

16. The method for manufacturing the semiconductor device according to claim 10,
wherein a hydrogen concentration in the silicon oxynitride film is less than $7.2 \times 10^{20}$ atoms/cm$^3$.

17. The method for manufacturing the semiconductor device according to claim 10,
wherein c-axes are aligned, and a-axes and/or b-axes are not macroscopically aligned in the oxide semiconductor layer.

18. The method for manufacturing the semiconductor device according to claim 10,
wherein the oxide semiconductor layer includes microcrystal (also referred to as nanocrystal) with a size greater than or equal to 1 nm and less than 10 nm.

19. A method for manufacturing a semiconductor device, comprising the steps of:
forming an oxide semiconductor layer containing In and Ga at a proportion of In>Ga;
etching a part of the oxide semiconductor layer by a wet etching method;
forming a source electrode and a drain electrode over the oxide semiconductor layer;
forming a silicon oxynitride film over the source electrode and the drain electrode; and
introducing oxygen to the silicon oxynitride film by a plasma treatment under an oxygen atmosphere,
wherein a copper concentration in the oxide semiconductor layer is less than or equal to $1 \times 10^{18}$ atoms/cm$^3$.

20. The method for manufacturing the semiconductor device according to claim 19,
wherein part of oxygen introduced into the silicon oxynitride film is introduced into the oxide semiconductor layer through the silicon oxynitride film.

21. The method for manufacturing the semiconductor device according to claim 19,
wherein the oxide semiconductor layer contains In, Ga, and Zn with an atomic ratio of In:Ga:Zn=3/6:1/6:2/6 or in the neighborhood of In:Ga:Zn=3/6:1/6:2/6, and
wherein an oxide semiconductor layer with an atomic ratio of In:Ga:Zn=A:B:C (A+B+C=1) and satisfying $(3/6-A)^2+(1/6-B)^2+(2/6-C)^2 \leq 0.0025$ is in the neighborhood of In:Ga:Zn=3/6:1/6:2/6.

22. The method for manufacturing the semiconductor device according to claim 19,
wherein the oxide semiconductor layer contains In, Ga, and Zn with an atomic ratio of In:Ga:Zn=2/6:1/6:3/6 or in the neighborhood of In:Ga:Zn=2/6:1/6:3/6, and
wherein an oxide semiconductor layer with an atomic ratio of In:Ga:Zn=A:B:C (A+B+C=1) and satisfying $(2/6-A)^2+(1/6-B)^2+(3/6-C)^2 \leq 0.0025$ is in the neighborhood of In:Ga:Zn=2/6:1/6:3/6.

23. The method for manufacturing the semiconductor device according to claim 19,
wherein the oxide semiconductor layer contains In and Ga at a proportion of In>2 Ga.

24. The method for manufacturing the semiconductor device according to claim 19, further comprising a step of:
forming a gate electrode with a stacked-layer structure including a first layer comprising a light-transmitting conductive material and a second layer comprising a metal element.

25. The method for manufacturing the semiconductor device according to claim 19,
wherein a hydrogen concentration in the silicon oxynitride film is less than $7.2 \times 10^{20}$ atoms/cm$^3$.

26. The method for manufacturing the semiconductor device according to claim 19,
wherein c-axes are aligned, and a-axes or b-axes are not macroscopically aligned in the oxide semiconductor layer.

27. The method for manufacturing the semiconductor device according to claim 19,
wherein the oxide semiconductor layer includes microcrystal with a size greater than or equal to 1 nm and less than 10 nm.

* * * * *